(12) United States Patent
Cheng et al.

(10) Patent No.: US 9,773,903 B2
(45) Date of Patent: Sep. 26, 2017

(54) ASYMMETRIC III-V MOSFET ON SILICON SUBSTRATE

(71) Applicant: International Business Machines Corporation, Armonk, NY (US)

(72) Inventors: Cheng-Wei Cheng, White Plains, NY (US); Pranita Kerber, Mount Kisco, NY (US); Effendi Leobandung, Stormville, NY (US); Amlan Majumdar, White Plains, NY (US); Renee T. Mo, Yorktown Heights, NY (US); Yanning Sun, Scarsdale, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/377,722

(22) Filed: Dec. 13, 2016

(65) Prior Publication Data
US 2017/0092763 A1   Mar. 30, 2017

Related U.S. Application Data

(62) Division of application No. 14/841,033, filed on Aug. 31, 2015, now Pat. No. 9,553,166.

(51) Int. Cl.
| H01L 29/78 | (2006.01) |
| H01L 23/535 | (2006.01) |
| H01L 29/06 | (2006.01) |
| H01L 29/32 | (2006.01) |
| H01L 29/66 | (2006.01) |

(Continued)

(52) U.S. Cl.
CPC .... *H01L 29/7835* (2013.01); *H01L 21/31116* (2013.01); *H01L 23/535* (2013.01); *H01L 29/0649* (2013.01); *H01L 29/32* (2013.01); *H01L 29/66462* (2013.01); *H01L 29/66553* (2013.01); *H01L 29/7786* (2013.01); *H01L 29/785* (2013.01)

(58) Field of Classification Search
CPC ............ H01L 29/7835; H01L 29/7786; H01L 29/66462
See application file for complete search history.

(56) References Cited

U.S. PATENT DOCUMENTS

| 6,180,502 B1 | 1/2001 | Liang |
| 6,297,104 B1 | 10/2001 | Tyagi et al. |

(Continued)

FOREIGN PATENT DOCUMENTS

| TW | 375770 | 12/1999 |

OTHER PUBLICATIONS

List of IBM Patents or Patent Applications Treated As Related Dated Dec. 13, 2016, 2 Pages.

*Primary Examiner* — Amar Movva
(74) *Attorney, Agent, or Firm* — Scully, Scott, Murphy & Presser, P.C.; Louis J. Percello, Esq.

(57) ABSTRACT

A semiconductor structure containing a high mobility semiconductor channel material, i.e., a III-V semiconductor material, and asymmetrical source/drain regions located on the sidewalls of the high mobility semiconductor channel material is provided. The asymmetrical source/drain regions can aid in improving performance of the resultant device. The source region contains a source-side epitaxial doped semiconductor material, while the drain region contains a drain-side epitaxial doped semiconductor material and an underlying portion of the high mobility semiconductor channel material.

18 Claims, 25 Drawing Sheets

(51) Int. Cl.
*H01L 21/311* (2006.01)
*H01L 29/778* (2006.01)

(56) References Cited

U.S. PATENT DOCUMENTS

| | | |
|---|---|---|
| 6,384,457 B2 | 5/2002 | Tyagi et al. |
| 6,605,845 B1 | 8/2003 | Liang |
| 8,426,279 B2 | 4/2013 | Chen |
| 8,809,131 B2 | 8/2014 | Bangsaruntip et al. |
| 8,969,145 B2 | 3/2015 | Chang et al. |
| 2014/0203290 A1 | 7/2014 | Chang et al. |

ASYMMETRIC III-V MOSFET ON SILICON SUBSTRATE

BACKGROUND

The present application relates to semiconductor technology and more particularly to a semiconductor structure containing a high mobility semiconductor channel material, i.e., a III-V semiconductor material, and asymmetrical source/drain regions and a method of forming the same.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) or semiconductor nanowire or nanowire stack transistors, is the next step in the evolution of complementary metal oxide semiconductor (CMOS) devices. Such non-planar semiconductor devices can achieve higher drive currents with increasingly smaller dimensions as compared to conventional planar FETs.

In such non-planar semiconductor devices further device improvements can be achieved by utilizing a semiconductor channel material that provides high electron mobility. For example, III-V semiconductor materials are one promising candidate for providing high electron mobility devices. Methods are needed that enable one to form non-planar semiconductor devices that contain such high mobility channel materials without requiring the use of any thick buffer layer that is typically needed for forming such high mobility semiconductor channel materials.

SUMMARY

A semiconductor structure containing a high mobility semiconductor channel material, i.e., a III-V semiconductor material, and asymmetrical source/drain regions located on the sidewalls of the high mobility semiconductor channel material is provided. The asymmetrical source/drain regions can aid in improving performance of the resultant device. The source region contains a source-side epitaxial doped semiconductor material, while the drain region contains a drain-side epitaxial doped semiconductor material and an underlying portion of the high mobility semiconductor channel material. The term "high mobility" is used throughout the present application to denote a semiconductor material such a III-V compound semiconductor material that has an electron mobility that is much greater than, i.e., 2× to 10×, normal silicon mobility.

In one aspect of the present application, a semiconductor structure is provided. In one embodiment of the present application, a semiconductor structure is provided that includes at least one functional gate structure straddling over a surface of a high mobility semiconductor channel material. The semiconductor structure further includes a source region located on one side of the at least one functional gate structure and containing a source-side epitaxial doped semiconductor material extending laterally from a sidewall surface of the high mobility semiconductor channel material. The semiconductor structure even further includes a drain region located on another side of the at least one functional gate structure and containing a drain-side epitaxial doped semiconductor material and a portion of the high mobility semiconductor channel material that extends beyond a sidewall surface of the at least one functional gate structure. In accordance with the present application, the source-side epitaxial doped semiconductor material and the drain-side epitaxial doped semiconductor material comprise a different semiconductor material than the high mobility semiconductor channel material. In one embodiment, the high mobility semiconductor channel material is a III-V semiconductor material as such as, for example, GaAs, InAs or InGaAs.

In another aspect of the present application, a method of forming a semiconductor structure is provided. In one embodiment of the present application, a method of forming a semiconductor structure is provided that includes providing at least one sacrificial gate structure straddling over at least one semiconductor material portion that is located on a surface of a substrate, wherein a layer of silicon nitride is located on exposed surfaces of the at least one sacrificial gate structure, the at least one semiconductor material and the substrate. The layer of silicon nitride is then patterned to expose a drain region located on one side of the at least one sacrificial gate structure. An exposed portion of the at least one semiconductor material portion in the drain region is then removed to provide an opening to the substrate. Next, a semiconductor buffer layer is formed in a portion of the opening. The at least one sacrificial gate structure is thereafter removed to provide a gate cavity that exposes a remaining portion of the at least one semiconductor material portion. The exposed portion of the remaining portion of the at least one semiconductor material is then removed to provide at least one semiconductor material portion structure. A laterally etch is then performed on an exposed sidewall surface of the buffer layer. A high mobility semiconductor channel material is thereafter grown from sidewall surfaces of the at least one semiconductor material portion structure and from sidewall surfaces of a remaining portion of the buffer layer. Next, a functional gate structure is formed in the gate cavity and on a portion of the high mobility semiconductor channel material, wherein another portion of the high mobility semiconductor channel material in the drain region extends beyond sidewalls of the at least one functional gate structure. Contact openings are formed on a source side and a drain side of the functional gate structure. Next, the at least one semiconductor material portion structure and the remaining portion of the buffer layer are removed within the contact openings. A source-side epitaxial doped semiconductor material is formed in the source side and extending laterally from a sidewall surface of the high mobility semiconductor channel material and on another portion of the topmost surface of the surface, and a drain-side epitaxial doped semiconductor material is formed in the drain side and on the another portion of the high mobility semiconductor channel material in the drain region that extends beyond sidewalls of the at least one functional gate structure.

DETAILED DESCRIPTION

Figure 1A:
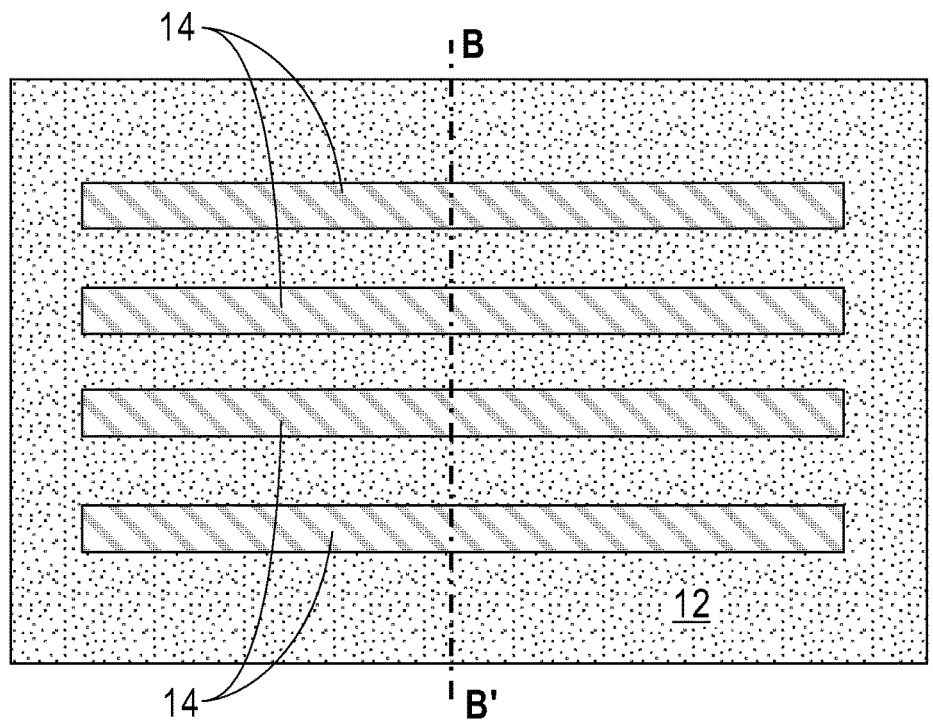
FIG. 1A is a top down view of an exemplary semiconductor structure including a plurality of silicon fins extending upwards from a surface of an insulator layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
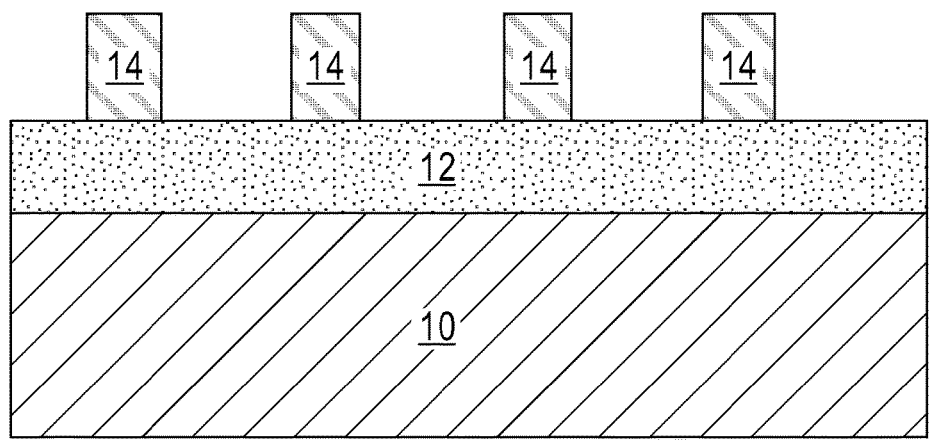
FIG. 1B is a cross sectional view of the exemplary semiconductor structure of FIG. 1A along vertical plane B-B'.

Referring first to FIGS. 1A-1B, there are illustrated an exemplary semiconductor structure including a plurality of silicon fins 14 (each silicon fin may also be referred to as a silicon material portion) extending upwards from a surface of an insulator layer 12 that can be employed in accordance with an embodiment of the present application. In the illustrated embodiment, there is a material interface between the bottommost surface of each silicon fin 14 and the insulator layer 12. In some embodiments and as illustrated, the insulator layer 12 may be present on a surface of a handle substrate 10. When employed, the handle substrate 10 provides mechanical support to the insulator layer 12 and each silicon fin 14. In the illustrated embodiment, silicon is used as the material of the silicon fins. Although silicon is described and illustrated, other semiconductor materials such as, for example, SiGe, Ge, SiC, or SiGeC, can be used instead of, or in conjugation with, silicon.

In some embodiments of the present application, the handle substrate 10 may comprise a semiconductor material. The term "semiconductor" as used herein in connection with the semiconductor material of the handle substrate 10 denotes any semiconducting material including, for example, Si, Ge, SiGe, SiC, SiGeC, or III/V compound semiconductors such as, for example, InAs, GaAs or InP. Multilayers of these semiconductor materials can also be used as the semiconductor material of the handle substrate 10. In one embodiment, the handle substrate 10 is composed of silicon. In some embodiments, the handle substrate 10 is a non-semiconductor material including, for example, a dielectric material and/or a conductive material. In some embodiments, the handle substrate 10 may be omitted.

The handle substrate 10 and each silicon fin 14 may have the same or different crystal orientation. For example, the crystal orientation of the handle substrate 10 and/or each silicon fin 14 may be {100}, {110}, or {111}. Other crystallographic orientations besides those specifically mentioned can also be used in the present application. The handle substrate may be a single crystalline semiconductor material, a polycrystalline material, or an amorphous material.

The insulator layer 12 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride. Insulator layer 12 can be formed from a SOI (silicon-on-insulator) starting wafer, or it can be formed using other processes such as a SON (silicon-on-nothing) process in which a cavity is formed under the silicon fins 14 and thereafter filled with an insulator material using a shallow trench isolation process.

Each silicon fin 14 is typically composed of single crystalline silicon. Each silicon fin 14 can be formed by subjecting a silicon layer that is present on a surface of insulator layer 12 to a fin patterning process. Collectively, the handle substrate 10, the insulator layer 12 and the silicon layer that provides each silicon fin 14 can be referred to herein as a silicon-on-insulator (SOI) substrate. The SOI substrate may be formed utilizing a layer transfer process or by an implantation process referred to as SIMOX (i.e., Separation by IMplantation of OXygen).

In some embodiments, the thickness of the silicon layer that provides each silicon fin 14 is from 10 nm to 100 nm. Other thicknesses that are lesser than, or greater than, the aforementioned thickness range may also be employed as the thickness of the silicon layer that provides each silicon fin 14 in the present application. The insulator layer 12 of the SOI substrate typically has a thickness from 1 nm to 200 nm. Other thicknesses that are lesser than, or greater than, the aforementioned thickness range may also be used as the thickness of the insulator layer 12. The thickness of the handle substrate 10 of the SOI substrate is inconsequential to the present application.

In some embodiments (not shown), a bulk semiconductor material is used instead of the SOI substrate shown above. In such an embodiment, the entirety of the substrate is composed of one or more semiconductor materials and the topmost portion of the bulk semiconductor is used in providing the fins. Also, and in such an embodiment, each silicon fin 14 would extend upwards from a remaining portion of the bulk semiconductor substrate. In some instances, no material interface exists between the silicon fins and the remaining portion of bulk semiconductor substrate.

In one embodiment of the present application, fin patterning may be performed by lithography and etching. Lithography includes forming a photoresist material (not shown) atop a material layer or material stack that needs to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material layer or material stack. The pattern provided by the patterned photoresist material is thereafter transferred into the underlying material layer or material stack utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, fin patterning may be performed utilizing a sidewall image transfer (SIT) process. The SIT process includes forming a contiguous mandrel material layer (not shown) atop a material layer or material stack that needs to be patterned. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material layer or material stack. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous structure including a semiconductor material such as, for example, silicon, and including a pair of vertical sidewalls that are parallel to each other. As used herein, a surface is "vertical" if there exists a vertical plane from which the surface does not deviate by more than three times the root mean square roughness of the surface. In one embodiment of the present application, each silicon fin 14 has a height from 10 nm to 100 nm, a width from 5 nm to 30 nm, and a length from 100 nm to 2000 nm. Other heights, and/or widths, and/or lengths that are lesser than, or greater than, the aforementioned ranges may also be employed in the present application. Each silicon fin 14 is spaced apart from a neighboring silicon fin 14, and each silicon fin 14 is orientated parallel to one another.

Figure 2A:
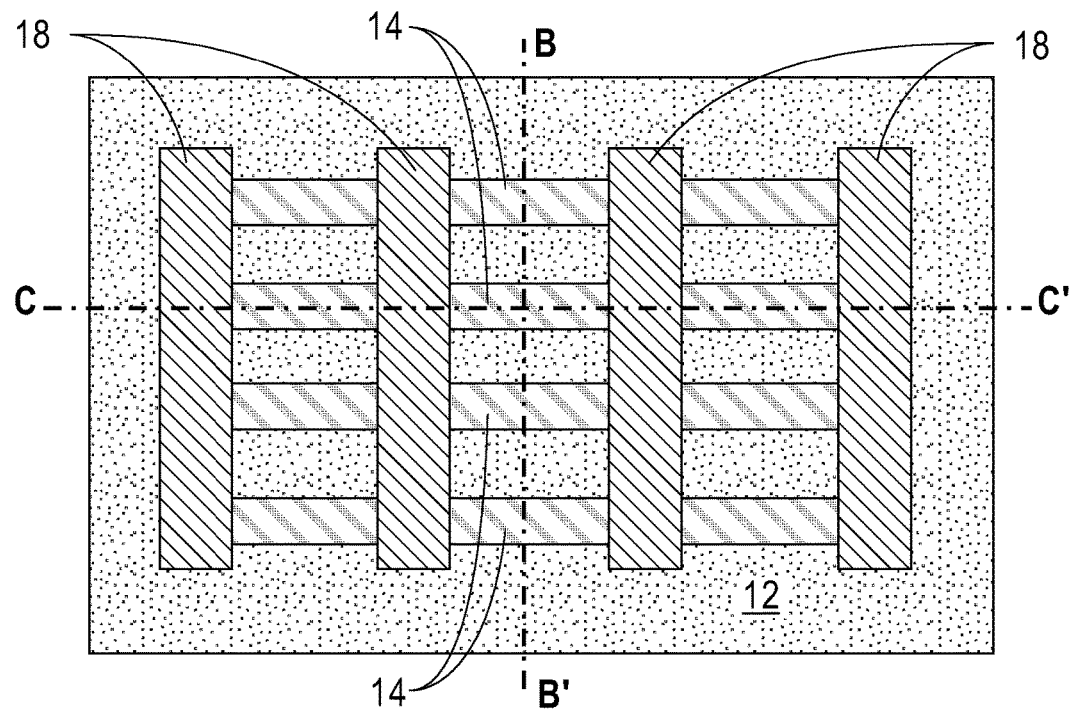
FIG. 2A is a top down view of the exemplary semiconductor structure of FIGS. 1A-1B after forming sacrificial gate structures straddling over different portions of each silicon fin.
Figure 2B:
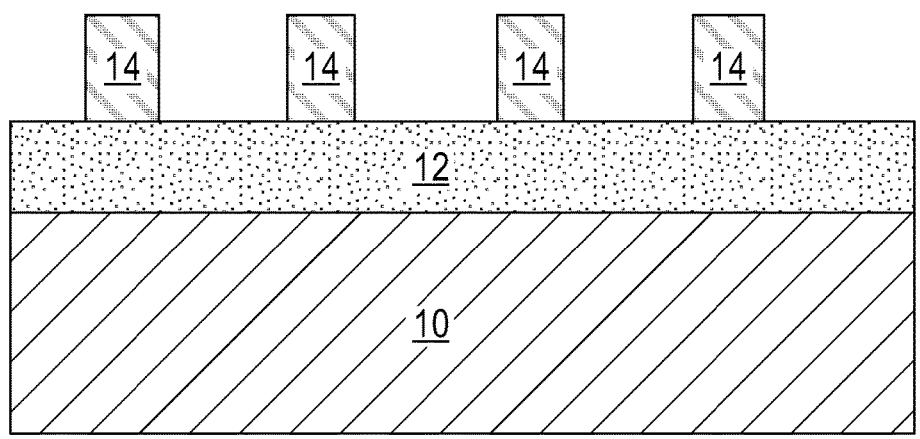
FIG. 2B is a cross sectional view of the exemplary semiconductor structure of FIG. 2A along vertical plane B-B'.
Figure 2C:
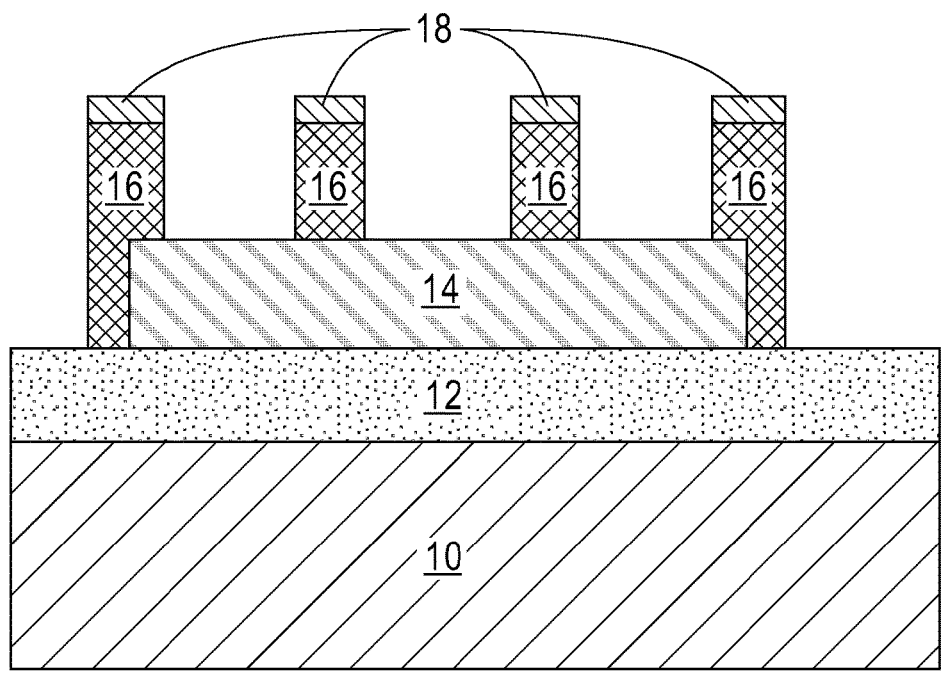
FIG. 2C is a cross sectional view of the exemplary semiconductor structure of FIG. 2A along vertical plane C-C'.

Referring now to FIGS. 2A-2C, there are illustrated the exemplary semiconductor structure of FIGS. 1A-1B after forming sacrificial gate structures (16, 18) straddling over different portions of each silicon fin 14. Each sacrificial gate structure (16, 18) lies perpendicular to each silicon fin 14, and each sacrificial gate structure (16, 18) is orientated parallel to each other. By "sacrificial gate structure" it is meant a material or material stack that serves as a placeholder for a subsequently formed functional gate structure.

By "straddling over" it is meant that at least one portion of each gate sacrificial structure is located on one side of each silicon fin 14, while another portion of the same sacrificial gate structure is located on another side of each silicon fin 14. The two sacrificial gate portions are interconnected by a portion of the sacrificial gate structure that is located directly atop of each silicon fin 14. As shown in the illustrated embodiment, a portion of the each sacrificial gate structure contacts a topmost surface of insulator layer 12.

Each sacrificial gate structure may include a sacrificial gate dielectric portion (not shown), a sacrificial gate material portion 16 and a sacrificial gate cap portion 18. In some embodiments, each sacrificial gate dielectric portion and/or each sacrificial gate cap portion 18 may be omitted. Each sacrificial gate dielectric portion may include an oxide, nitride, and/or oxynitride. In one example, each sacrificial gate dielectric portion may include silicon dioxide and/or silicon nitride. In another embodiment, each sacrificial gate dielectric portion may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each sacrificial gate dielectric portion.

Each sacrificial gate material portion 16 may include polysilicon, amorphous silicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Each sacrificial gate cap portion 18 includes a hard mask material such as, for example, silicon dioxide, silicon nitride, and/or silicon oxynitride.

The sacrificial gate structures can be formed by deposition of the various sacrificial material layers and then patterning the resultant sacrificial material sack by utilizing, for example, lithography and etching. The height of each sacrificial gate structure may be from 50 nm to 200 nm, although other heights that are lesser than, or greater than, the aforementioned height range may be employed.

Figure 3A:
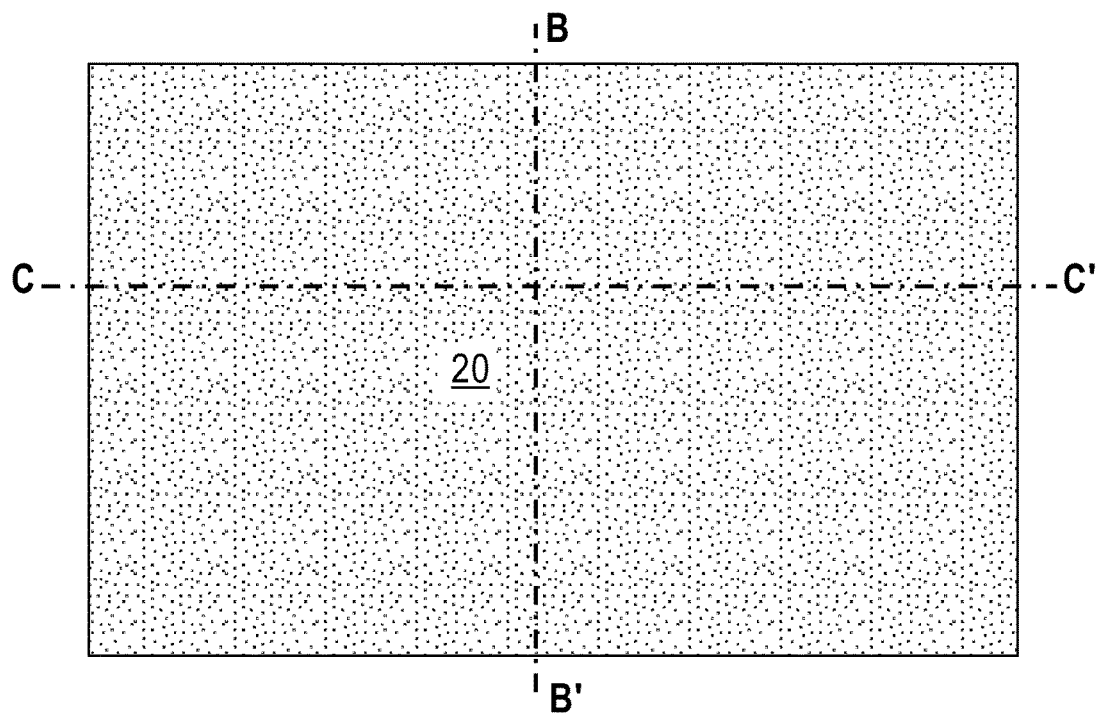
FIG. 3A is a top down view of the exemplary semiconductor structure of FIGS. 2A-2C after forming a layer of silicon nitride.
Figure 3B:
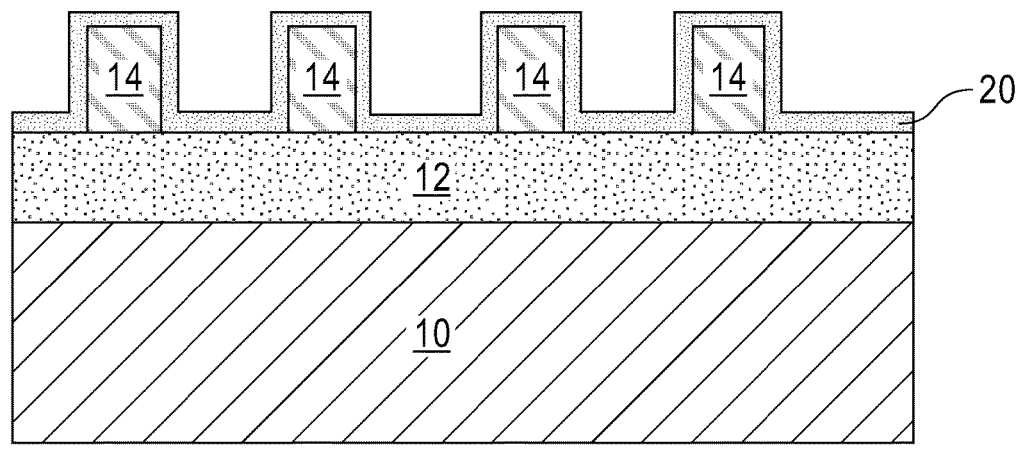
FIG. 3B is a cross sectional view of the exemplary semiconductor structure of FIG. 3A along vertical plane B-B'.
Figure 3C:
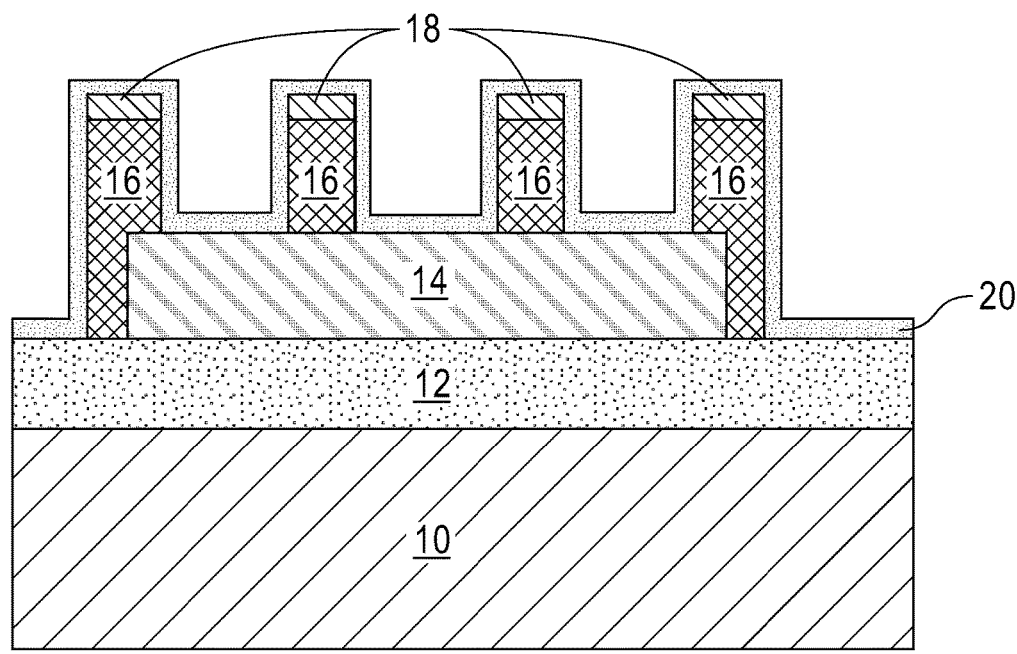
FIG. 3C is a cross sectional view of the exemplary semiconductor structure of FIG. 3A along vertical plane C-C'.

Referring now to FIGS. 3A-3C, there are shown the exemplary semiconductor structure of FIGS. 2A-2C after forming a layer of silicon nitride 20. It some embodiments, silicon nitride may also be used as the material for each sacrificial gate cap portion 18 mentioned above. The layer of silicon nitride 20 is a conformal layer that is contiguously formed (and thus located) over all exposed surfaces of the exemplary semiconductor structure illustrated in FIGS. 2A-2C. The layer of silicon nitride 20 may be formed by a deposition process such as, for example, chemical vapor deposition or plasma enhanced chemical vapor deposition. The thickness of the layer of silicon nitride 20 may be from 5 nm to 15 nm; although other thicknesses that are lesser than, or greater than, the aforementioned thickness range may be employed.

Figure 4A:
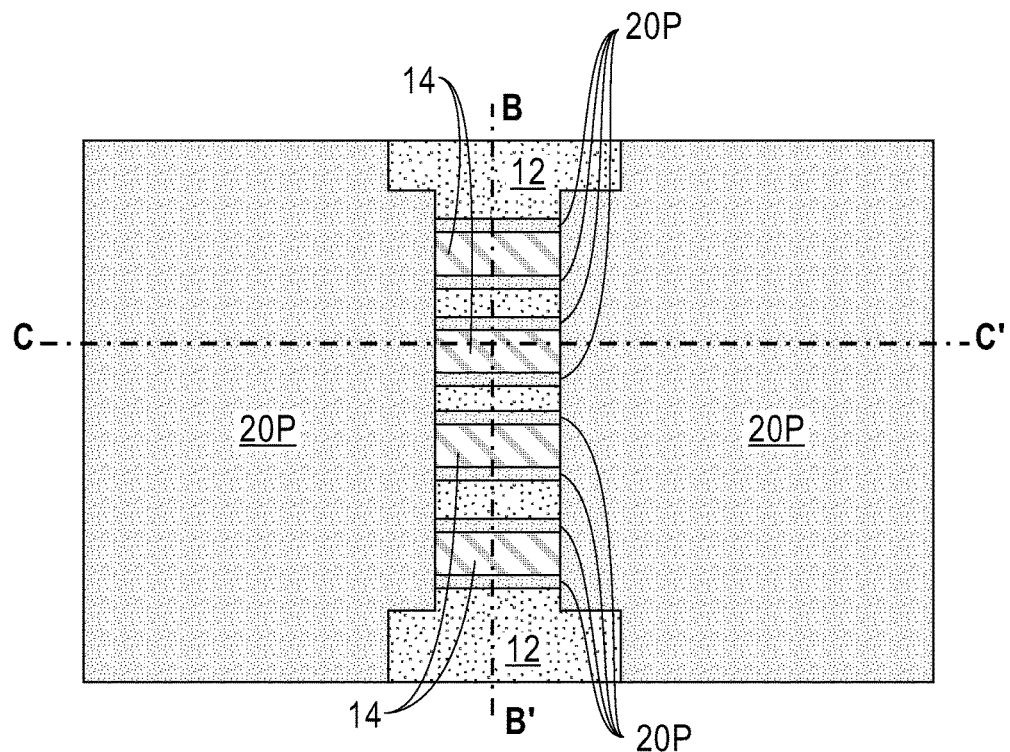
FIG. 4A is a top down view of the exemplary semiconductor structure of FIGS. 3A-3C after patterning the layer of silicon nitride in a drain region of the structure.
Figure 4B:
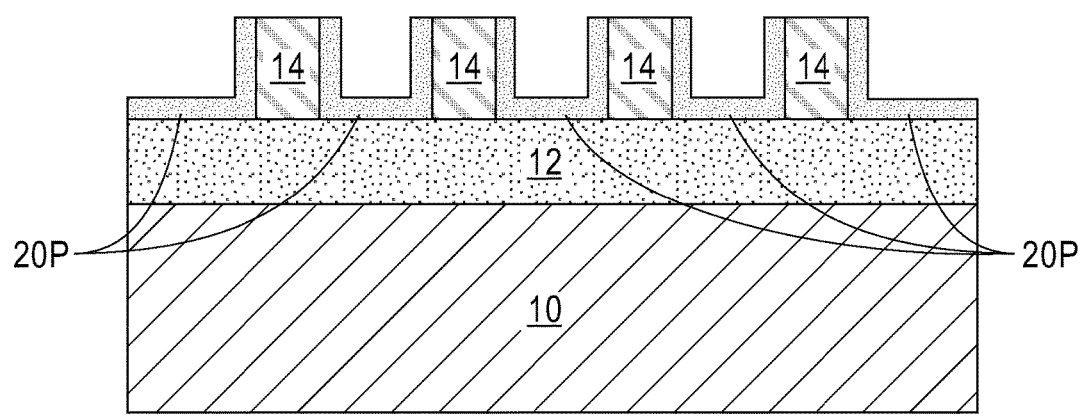
FIG. 4B is a cross sectional view of the exemplary semiconductor structure of FIG. 4A along vertical plane B-B'.
Figure 4C:
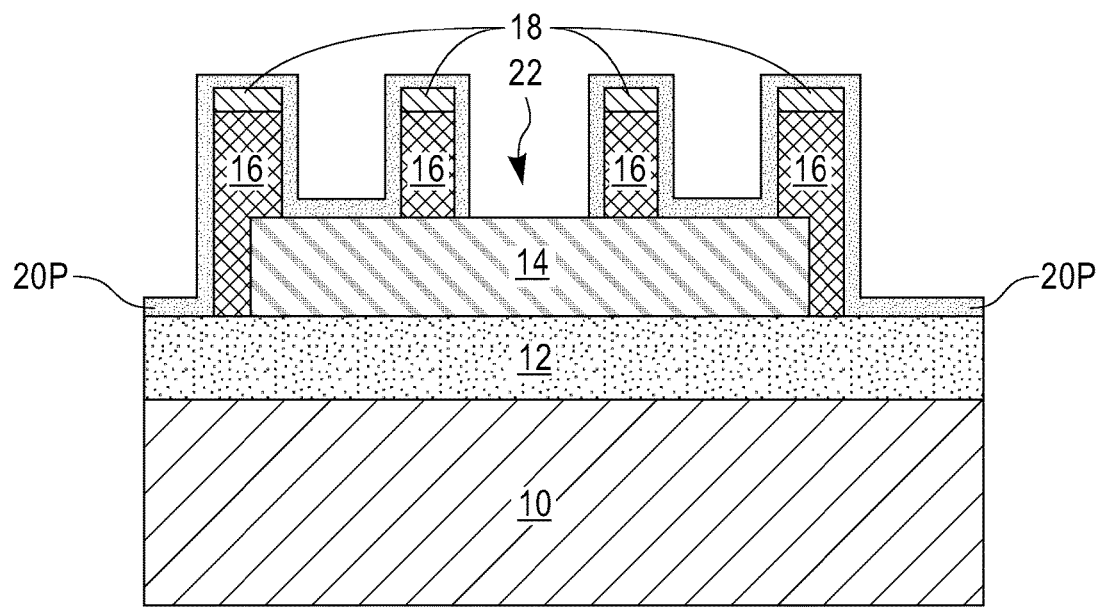
FIG. 4C is a cross sectional view of the exemplary semiconductor structure of FIG. 4A along vertical plane C-C'.

Referring now to FIGS. 4A-4C, there are illustrated the exemplary semiconductor structure of FIGS. 3A-3C after patterning the layer of silicon nitride 20 in a drain region of the structure. In the drawings of the present application, the drain region is the area that is located between the two middle sacrificial gate structures; notably, cross sectional view B-B' is through the drain region. As is shown in FIG. 4B, the patterning exposes a topmost surface of a first portion of each silicon fin 14 in the drain region. As is shown in FIG. 4C, the patterning of the layer of silicon nitride provides an opening 22 that exposes a first portion of each silicon fin 14 in the drain region. After patterning of the layer of silicon nitride 20, portions of the layer of silicon nitride remain atop other areas of the exemplary structure. Each remaining portion of the layer of silicon nitride 20 is referred to herein as a silicon nitride portion 20P.

The patterning of the layer of silicon nitride 20 may be performed by lithography and etching, as defined above. In one embodiment of the present application, the patterning of the layer of silicon nitride 20 may be performed utilizing an advanced lithographic tool such as, for example, an EUV tool. In such an embodiment, the lithographic tool may have an overlay tolerance of approximately 2 nm and a gate length of 15 nm. Please note that other devices such as Si or SiGe pFETs may exist on the wafer at this point of the process. Those devices will be processed in parallel through the source/drain and high temperature annealing steps (not shown). This will allow the formation of a high mobility channel nFET device after the pFET high temperature processing step.

Figure 5A:
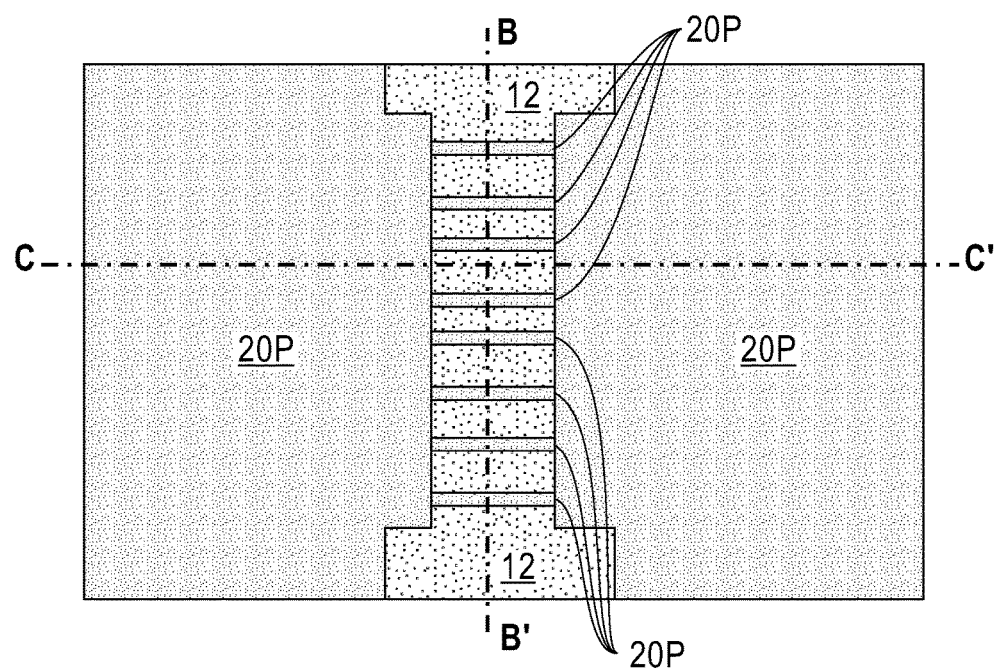
FIG. 5A is a cross sectional view of the exemplary semiconductor structure of FIGS. 4A-4C after removing an exposed first portion of each silicon fin in the drain region to provide silicon fin structures.
Figure 5B:
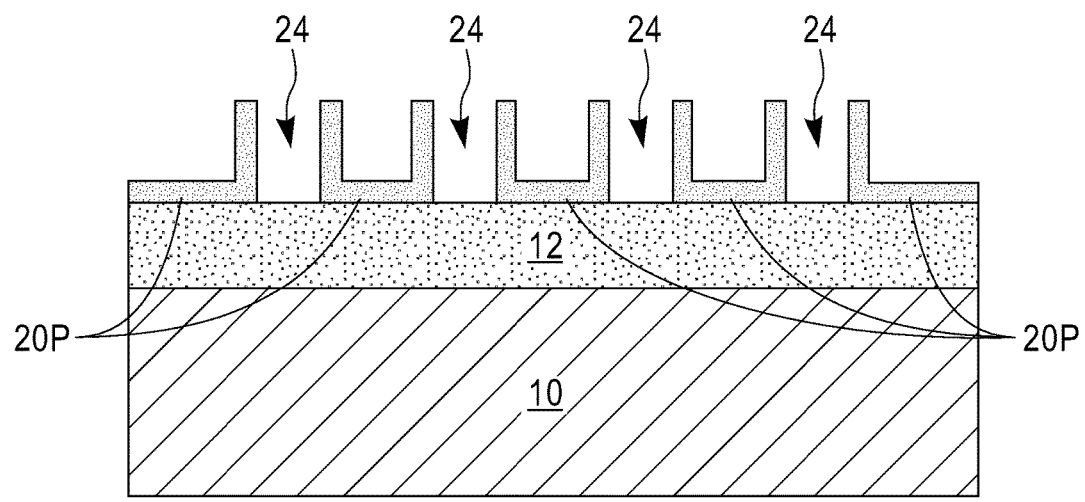
FIG. 5B is a cross sectional view of the exemplary semiconductor structure of FIG. 5A along vertical plane B-B'.
Figure 5C:
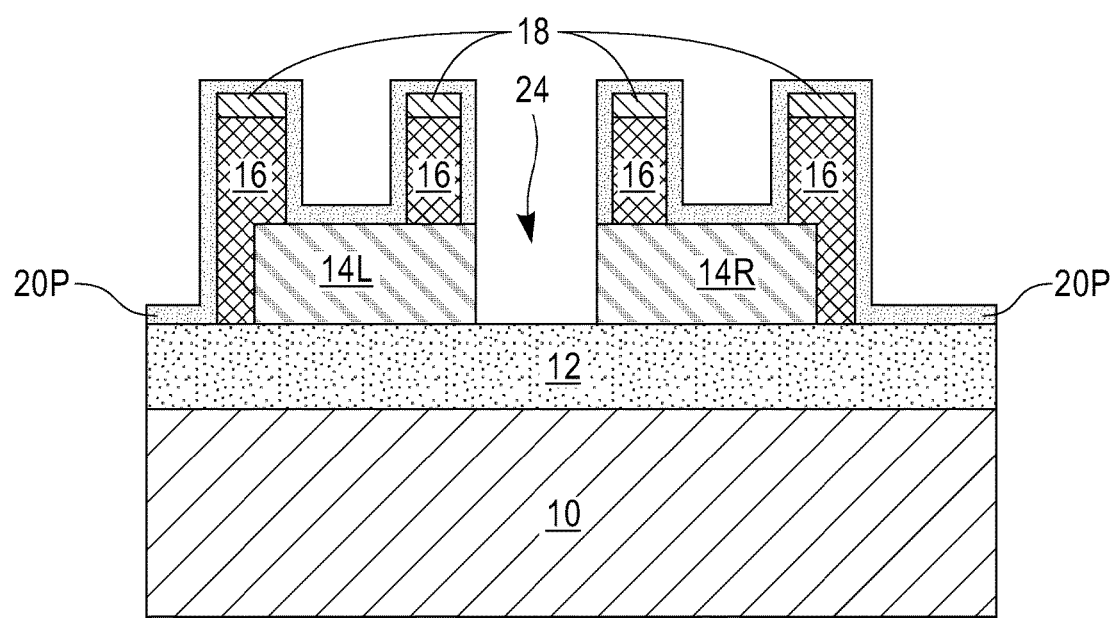
FIG. 5C is a cross sectional view of the exemplary semiconductor structure of FIG. 5A along vertical plane C-C'.

Referring now to FIGS. 5A-5C, there are illustrated the exemplary semiconductor structure of FIGS. 4A-4C after removing an exposed first portion of each silicon fin 14 in the drain region. The removing of the exposed first portion of each silicon fin 14 in the drain region utilizes each silicon nitride portion 20P as an etch mask. The removing of the exposed first portion of each silicon fin 14 may be performed utilizing an anisotropic etching process that selectively removes silicon as compared to a dielectric material such as, for example, silicon nitride.

The removing of the first portion of each silicon fin 14 provides openings 24 that expose different portions of the topmost surface of insulator layer 12. After removing the first portion of each silicon fin 14, first silicon fin structures 14L and second silicon fin structures 14R are formed. As is shown in FIG. 5C, each first silicon fin structure 14L is separated from each second silicon fin structure 14R by a lower portion of opening 24. In one example, KOH (potassium hydroxide) or TMAH (tetramethylammonium hydroxide) may be used in the removing of the exposed first portion of each silicon fin 14.

Figure 6A:
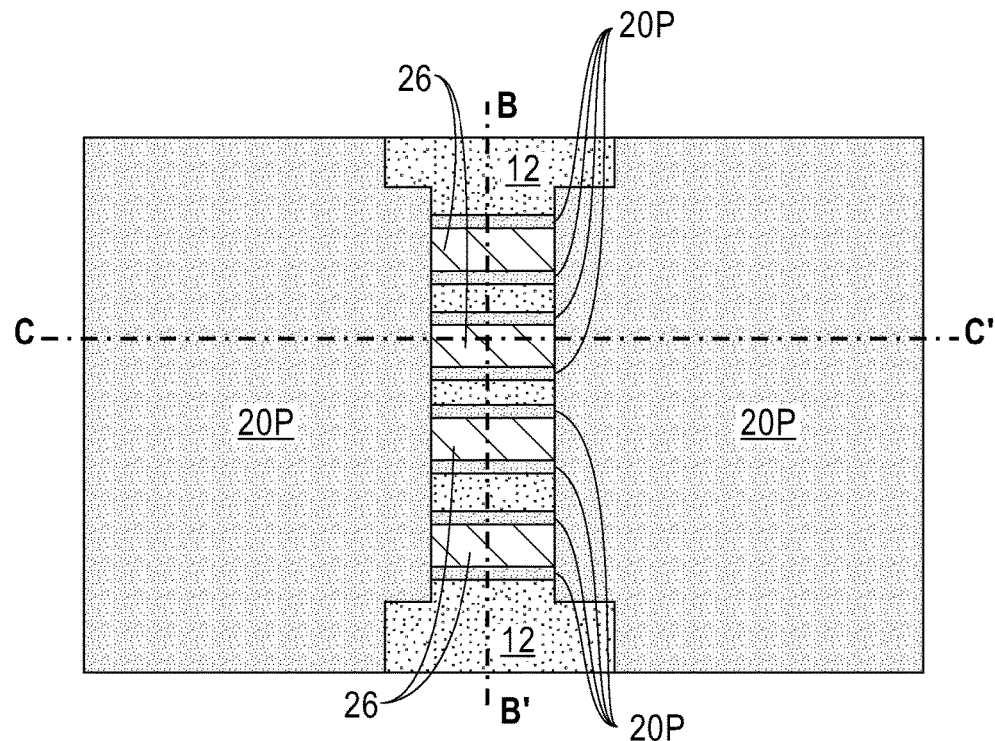
FIG. 6A is a cross sectional view of the exemplary semiconductor structure of FIGS. 5A-5C after forming a silicon germanium alloy (SiGe) structure in a volume occupied by each first portion of the silicon fin that was removed in the drain region.
Figure 6B:
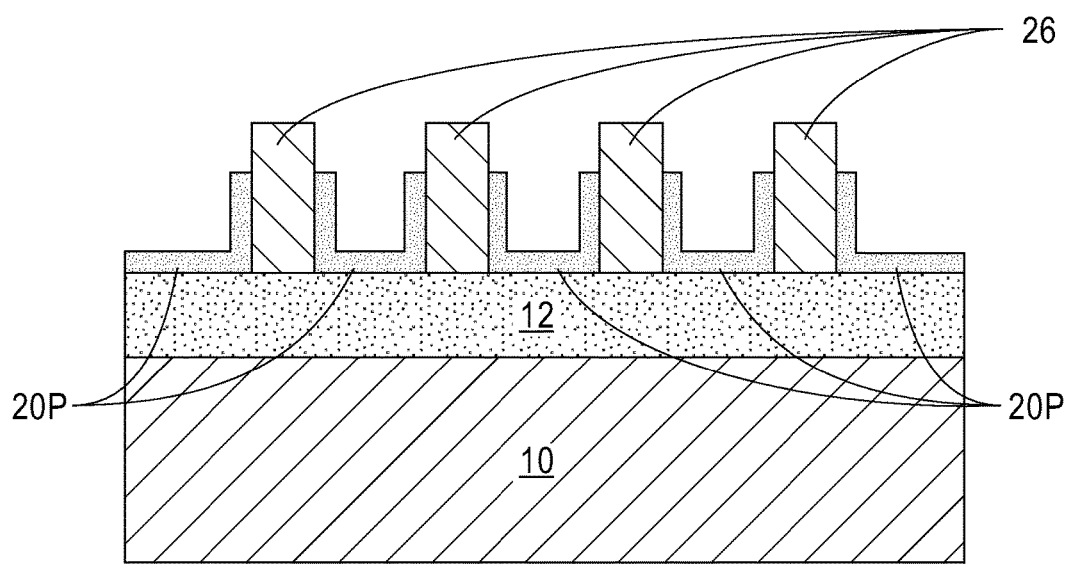
FIG. 6B is a cross sectional view of the exemplary semiconductor structure of FIG. 6A along vertical plane B-B'.
Figure 6C:
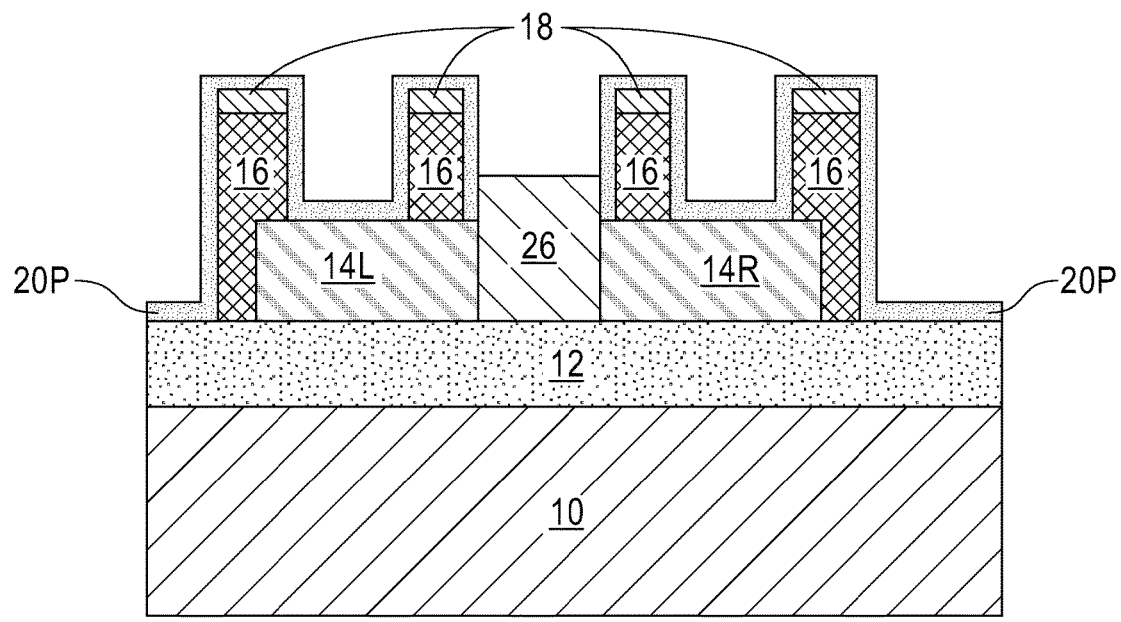
FIG. 6C is a cross sectional view of the exemplary semiconductor structure of FIG. 6A along vertical plane C-C'.

Referring now to FIGS. 6A-6C, there are illustrated the exemplary semiconductor structure of FIGS. 5A-5C after forming a silicon germanium alloy (SiGe) structure 26 in a volume occupied by each first portion of the silicon fin 14 that was removed in the drain region. Notably, each SiGe structure 26 is formed within opening 24 and has a bottommost surface that contacts a portion of the topmost surface of insulator layer 12. The SiGe structure 26 has sidewall surfaces that are bounded between portions of silicon nitride portions 20P as well as a sidewall surface of the first silicon fin structure 14L and the second silicon fin structure 14R. As is shown in FIG. 6C, the topmost surface of the SiGe structure 26 is located beneath a topmost surface of the sacrificial gate structures (16, 18). A portion of the SiGe structure 26 will serve as a buffer layer during subsequent growth of a high mobility semiconductor material.

Each SiGe structure 26 that is formed has a first germanium content. In one embodiment of the present application, the first germanium content is from 40 atomic percent germanium to 60 atomic percent germanium, the remainder up to 100 percent is composed of silicon. Other germanium contents that are lesser than, or greater than, the aforementioned first germanium content range may be employed in the present application. Each SiGe structure 26 can be formed utilizing an epitaxial growth (or deposition) process.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, each SiGe structure 26 has an epitaxial relationship with a sidewall surface of the first and second silicon fin structures (14L, 14R). Here, SiGe grows laterally from the exposed sidewall surfaces of the first and second silicon fin structures (14L, 14R). In the present application, a portion of the SiGe structure 26 will be used as a buffer layer in growing the III-V channel material.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of each SiGe structure 26. In some embodiments, the source gas for the deposition of each SiGe structure 26 may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, each SiGe structure 26 can be formed from a source gas that includes a compound containing silicon and germanium. Carrier gases like hydrogen, nitrogen, helium and argon can be used.

Figure 7A:
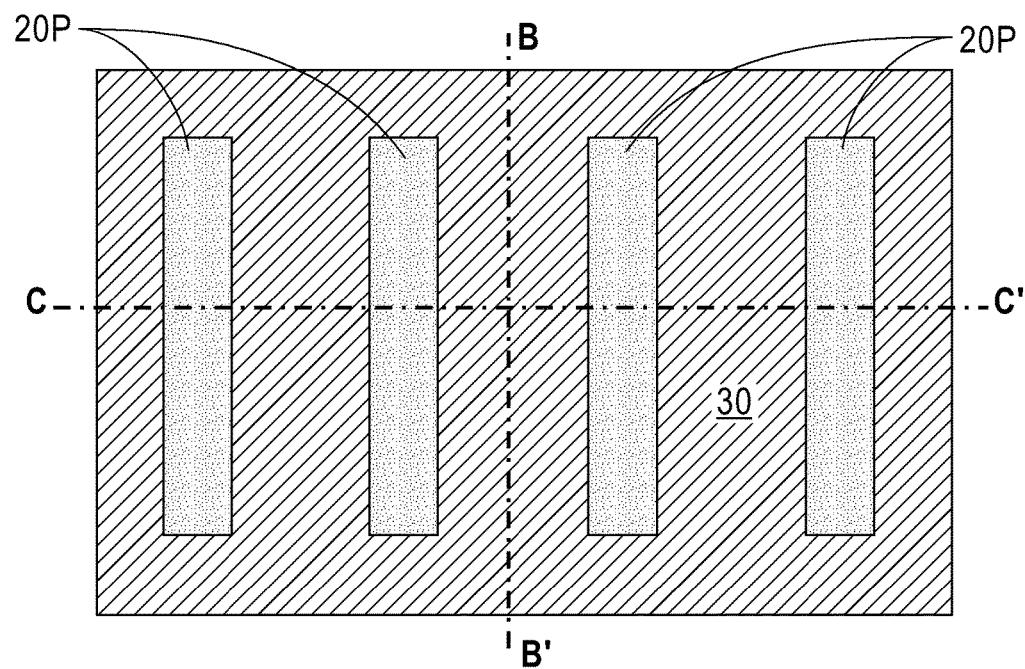
FIG. 7A is a top down view of the exemplary semiconductor structure of FIGS. 6A-6C after forming a middle-of-the-line (MOL) dielectric having a topmost surface that is coplanar with a topmost surface of a portion of the silicon nitride layer that remains atop each sacrificial gate structure.
Figure 7B:
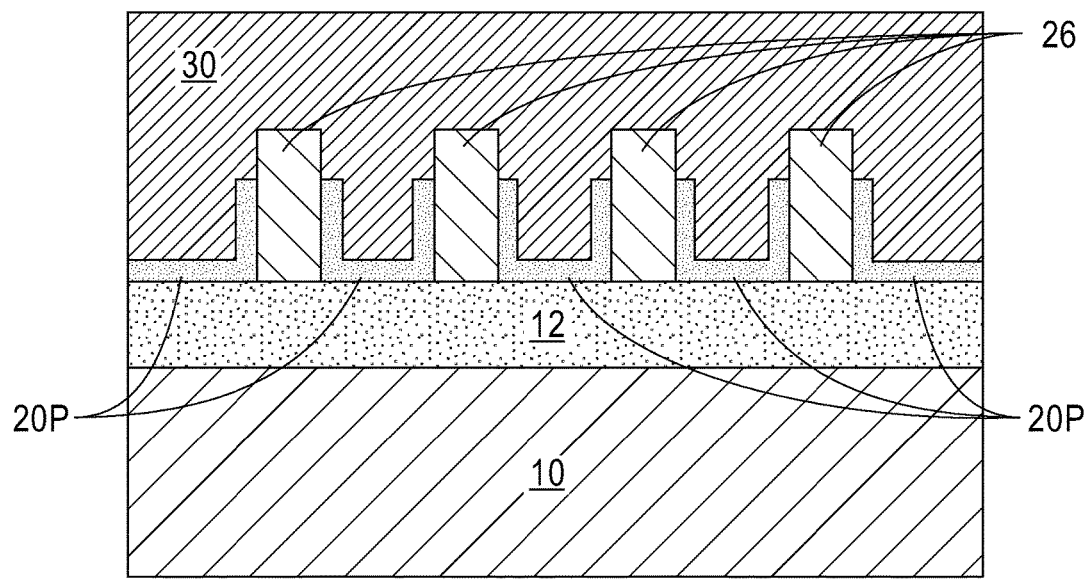
FIG. 7B is a cross sectional view of the exemplary semiconductor structure of FIG. 7A along vertical plane B-B'.
Figure 7C:
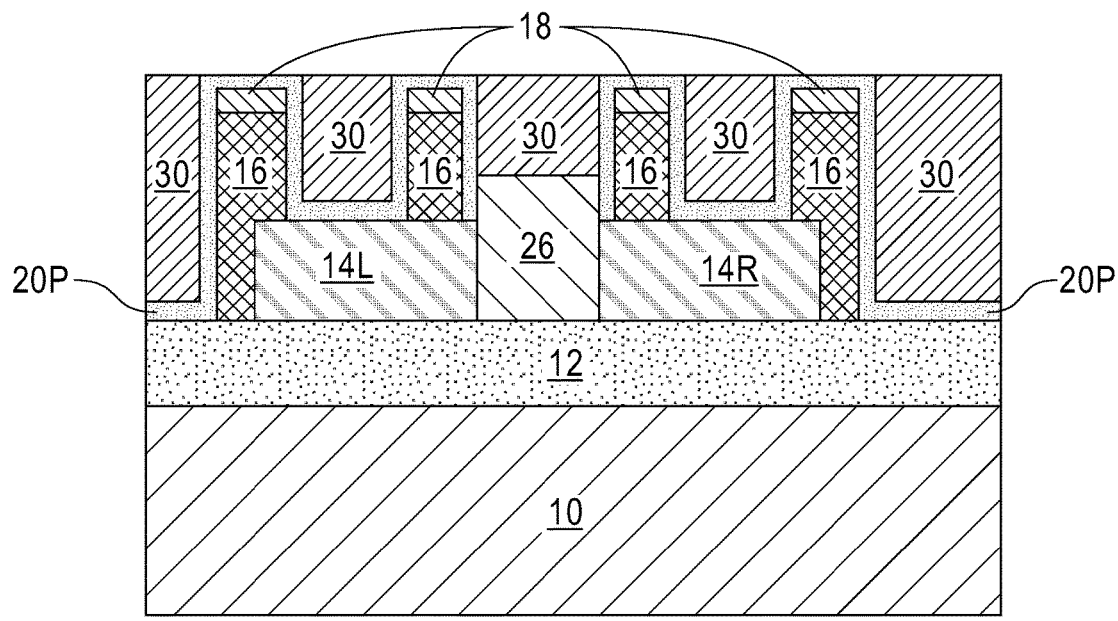
FIG. 7C is a cross sectional view of the exemplary semiconductor structure of FIG. 7A along vertical plane C-C'.

Referring now to FIGS. 7A-7C, there are illustrated the exemplary semiconductor structure of FIGS. 6A-6C after forming a middle-of-the-line (MOL) dielectric 30 having a topmost surface that is coplanar with a topmost surface of a portion of the silicon nitride layer (i.e., silicon nitride portion 20P) that remains atop each sacrificial gate structure (16, 18).

In one embodiment of the present application, the MOL dielectric 30 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the MOL dielectric 30. The use of a self-planarizing dielectric material as MOL dielectric 30 may avoid the need to perform a subsequent planarizing step.

In one embodiment, the MOL dielectric 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric 30, a planarization process or an etch back process follows the deposition of the MOL dielectric 30. The thickness of the MOL dielectric 30 that can be employed in the present application may vary depending on the type of dielectric material employed as well as the method that was employed in forming the same. In one embodiment, the MOL dielectric 30 has a thickness from 80 nm to 500 nm. Other thicknesses that are greater or lesser than the range provided above can also be used for the MOL dielectric 30.

Figure 8A:
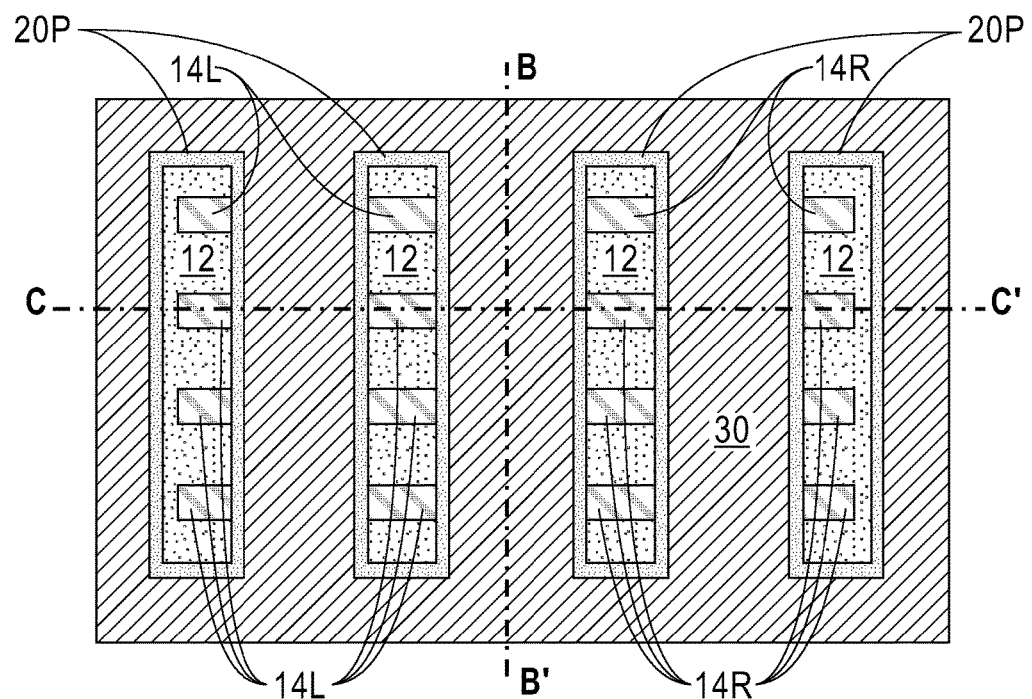
FIG. 8A is a top down view of the exemplary semiconductor structure of FIGS. 7A-7C after removing each sacrificial gate stack to provide gate cavities.
Figure 8B:
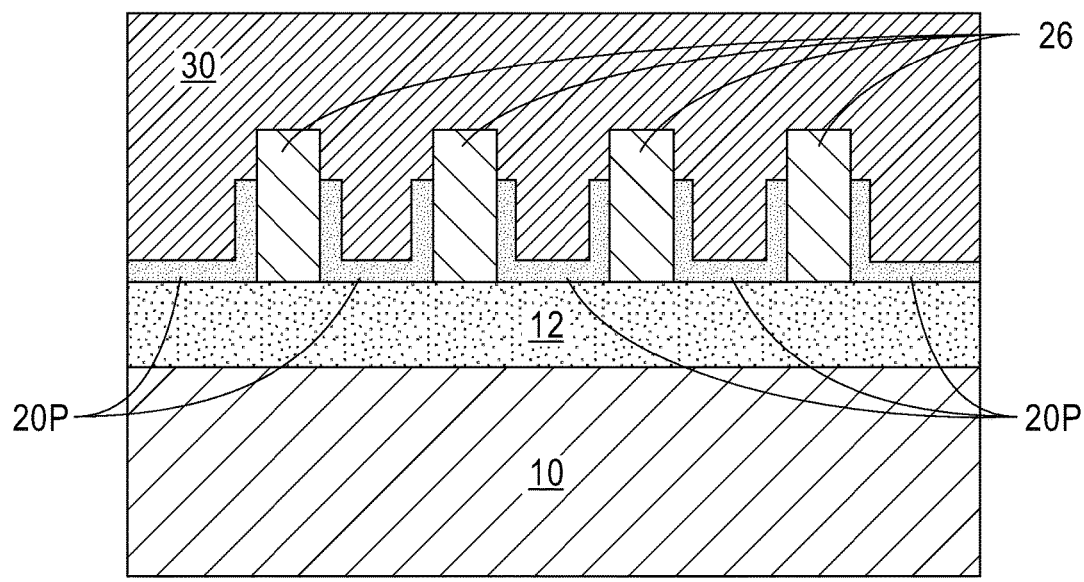
FIG. 8B is a cross sectional view of the exemplary semiconductor structure of FIG. 8A along vertical plane B-B'.
Figure 8C:
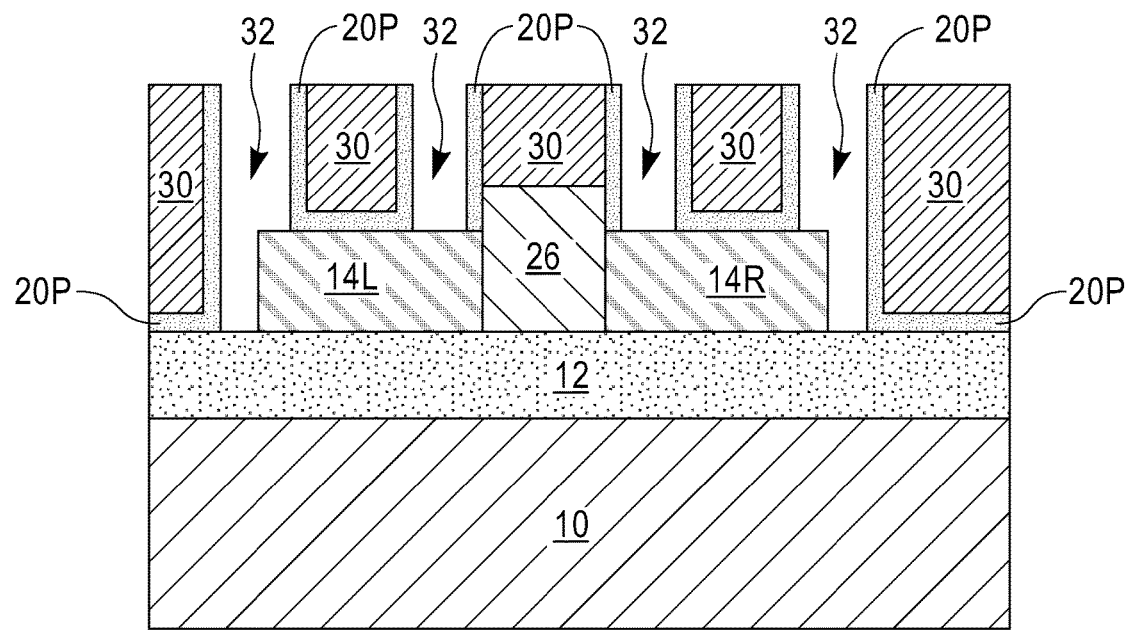
FIG. 8C is a cross sectional view of the exemplary semiconductor structure of FIG. 8A along vertical plane C-C'.

Referring now to FIGS. 8A-8C, there are illustrated the exemplary semiconductor structure of FIGS. 7A-7C after removing each sacrificial gate stack (16, 18) to provide gate cavities 32. The removing of each sacrificial gate stack includes a planarization process such as, for example, chemical mechanical polishing, that removes portions of the silicon nitride portion 20P and, if present, the sacrificial gate cap portion 18 from atop the sacrificial gate material 16 of each sacrificial gate structure. During this planarization process, an upper portion of the MOL dielectric 30 may be removed. Next, at least one etching process is used to remove the now exposed sacrificial gate material portion 16 and, if present, the underlying sacrificial gate dielectric portion. In one embodiment of the present application, the at least one etching process is a reactive ion etch (RIE).

As is shown, some of gate cavities that are formed, expose portions of the first silicon fin structure 14L, while some of the other gate cavities expose portions of the second silicon fin structure 14R. Also, exposed is a portion of the insulator layer 12. At this step of the present application, some of the gate cavities 32 have a upper portion that has a greater width than a lower portion due to the presence of a portion of the first and second silicon fin structures (14L, 14R).

Figure 9A:
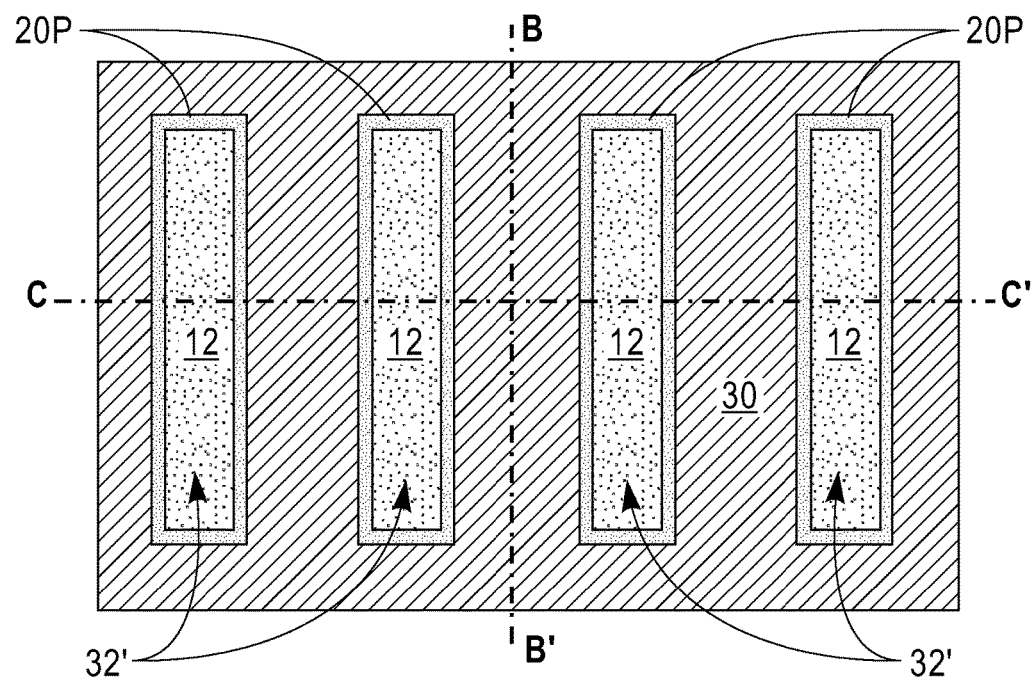
FIG. 9A to a top down view of the exemplary semiconductor structure of FIGS. 8A-8C after removing exposed portions of each silicon fin structure.
Figure 9B:
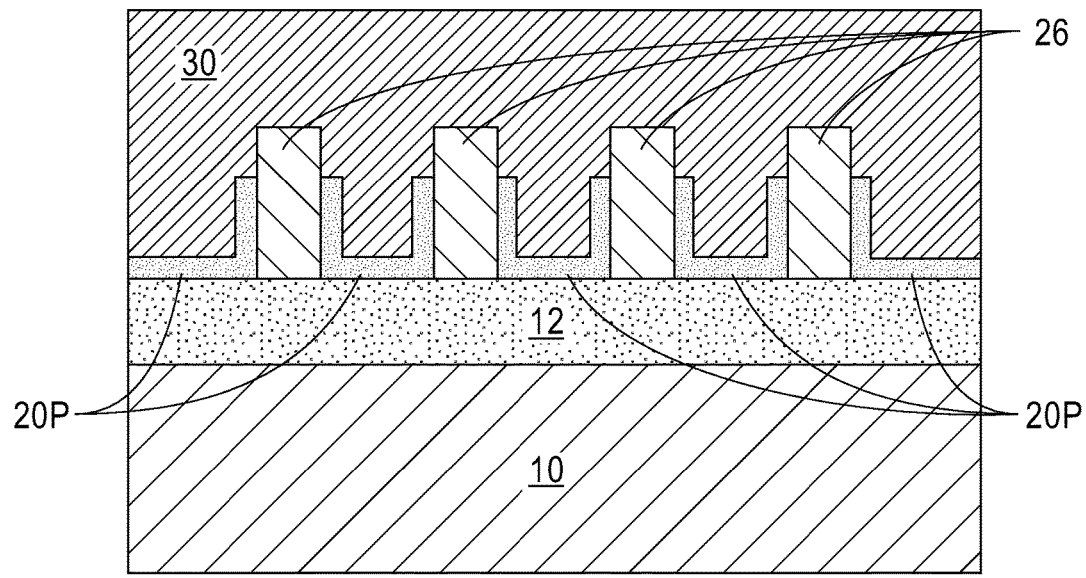
FIG. 9B is a cross sectional view of the exemplary semiconductor structure of FIG. 9A along vertical plane B-B'.
Figure 9C:
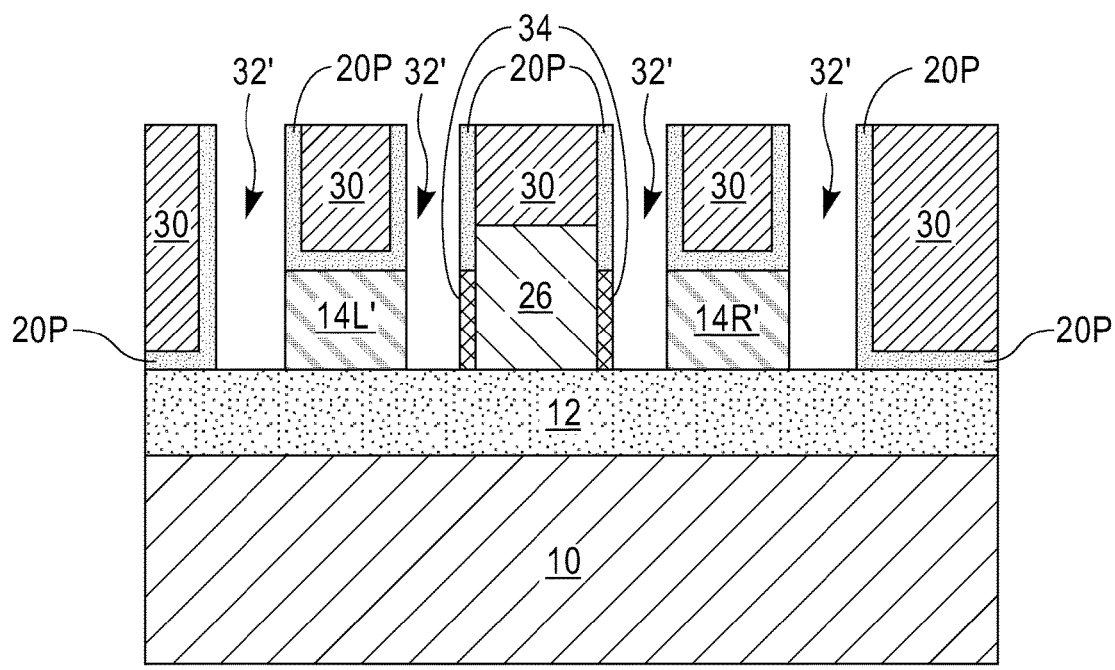
FIG. 9C is a cross sectional view of the exemplary semiconductor structure of FIG. 9A along vertical plane C-C'.

Referring now to FIGS. 9A-9C, there are illustrated the exemplary semiconductor structure of FIGS. 8A-8C after removing exposed portions of each first and second silicon fin structure (14L, 14R). The removing the exposed portions of each first and second silicon fin structure (14L, 14R) may be performed utilizing an anisotropic etching process that selectively removes silicon as compared to a dielectric material. In one example, a RIE using chlorine or bromine based chemistry may be used in the removing the exposed portions of each first and second silicon fin structure (14L, 14R).

The removing of the exposed portions of each first and second silicon fin structure (14L, 14R) extends some of the each gate cavities 32 (in the source regions) such that the upper and lower portions of each gate cavity 32 have a same width. Each gate cavity having the same upper and lower widths is hereinafter labeled as element 32' in the drawings. As is shown in FIG. 9C, a portion of the first silicon fin structure 14R remains along one sidewall surface of each SiGe structure 26, while a portion of the second silicon fin structure 14L remains along another sidewall surface of each SiGe structure 26. The portions of the first and second silicon fin structures that remain along the sidewalls of each SiGe structure 26 are referred to herein as a silicon spacer 34. As is further shown in FIG. 9C, another portion of the first silicon fin structure 14L and another portion of the second silicon fin structure 14R remain in the exemplary semiconductor structure. The remaining portion of the first silicon fin structure 14L is referred to herein as first silicon fin structure portion 14L', while the remaining portion of the second silicon fin structure 14R is referred to herein as second silicon fin structure portion 14R'.

Figure 10A:
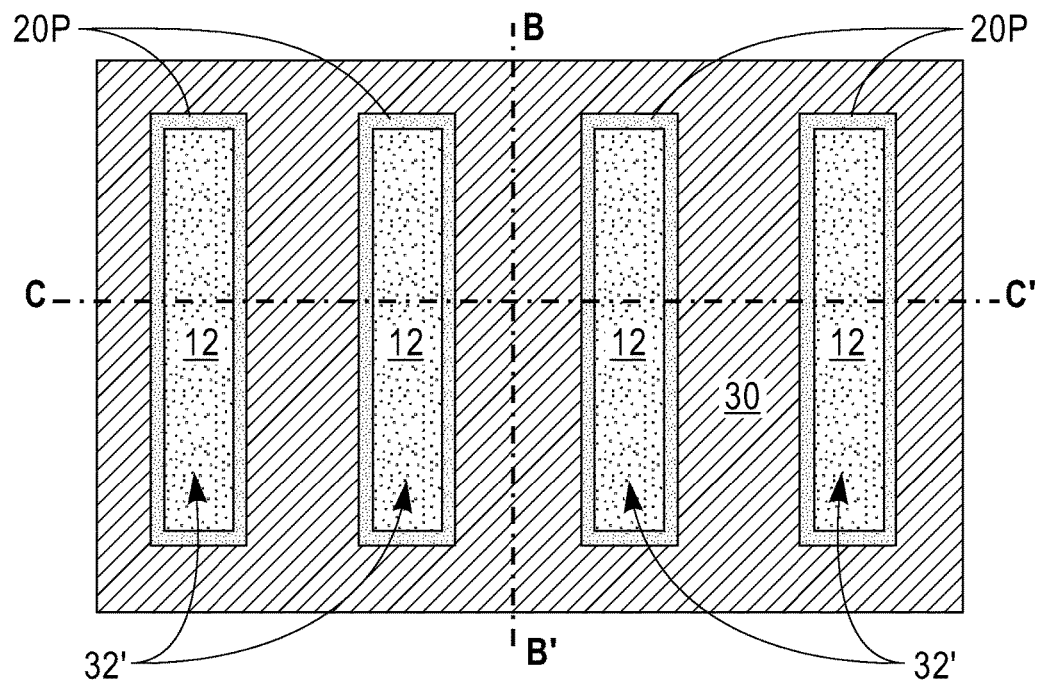
FIG. 10A is a top down view of the exemplary semiconductor structure of FIGS. 9A-9C after removing silicon spacers from sidewalls of the SiGe structure.
Figure 10B:
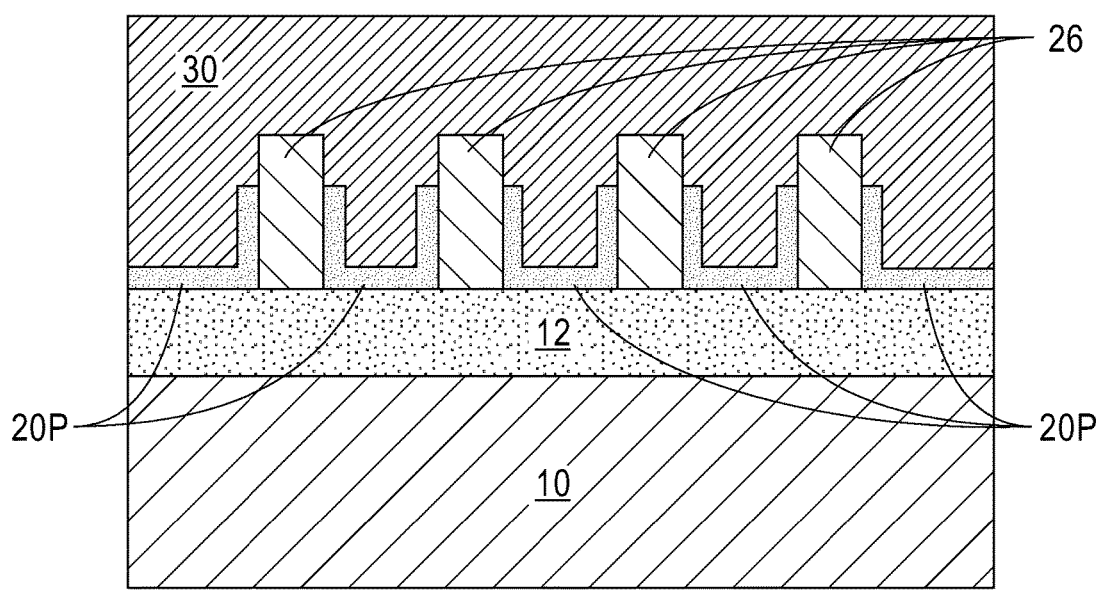
FIG. 10B is a cross sectional view of the exemplary semiconductor structure of FIG. 10A along vertical plane B-B'.
Figure 10C:
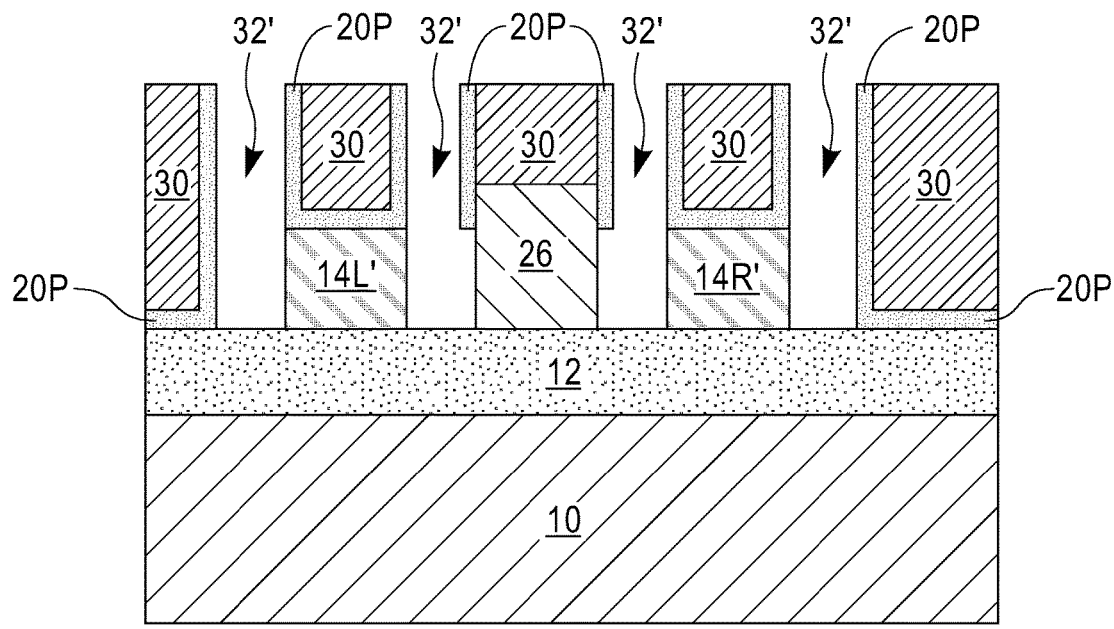
FIG. 10C is a cross sectional view of the exemplary semiconductor structure of FIG. 10A along vertical plane C-C'.

Referring now to FIGS. 10A-10C, there are illustrated the exemplary semiconductor structure of FIGS. 9A-9C after removing silicon spacers 34 from sidewalls of the SiGe structure 26. During the removing of the silicon spacers 34 from the exemplary semiconductor structure, the width of the first silicon fin structure portion 14L' and the width of the second silicon fin structure portion 14R' can be reduced as shown in FIG. 10C. This step of the present application may be performed utilizing a lateral etching process that selective removes silicon as compared to dielectric materials and SiGe. In one example, KOH, TMAH or anisotropic $SF_6$ based RIE may be used to remove the silicon spacers 34 from the exemplary semiconductor structure.

Figure 11A:
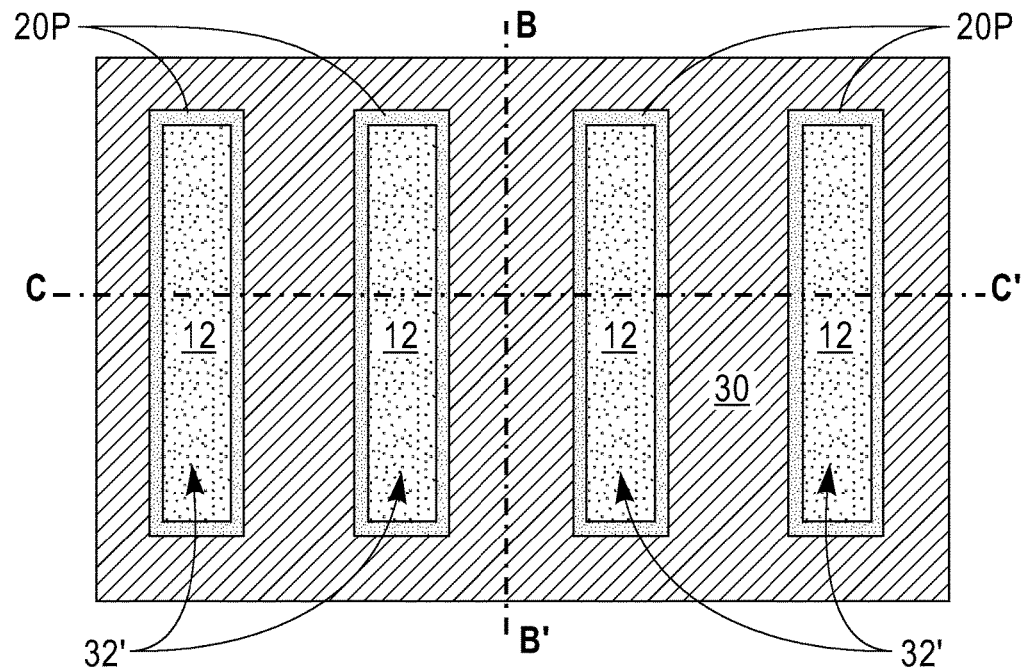
FIG. 11A is a top down view of the exemplary semiconductor structure of FIGS. 10A-10C after laterally etching portions of each SiGe structure.
Figure 11B:
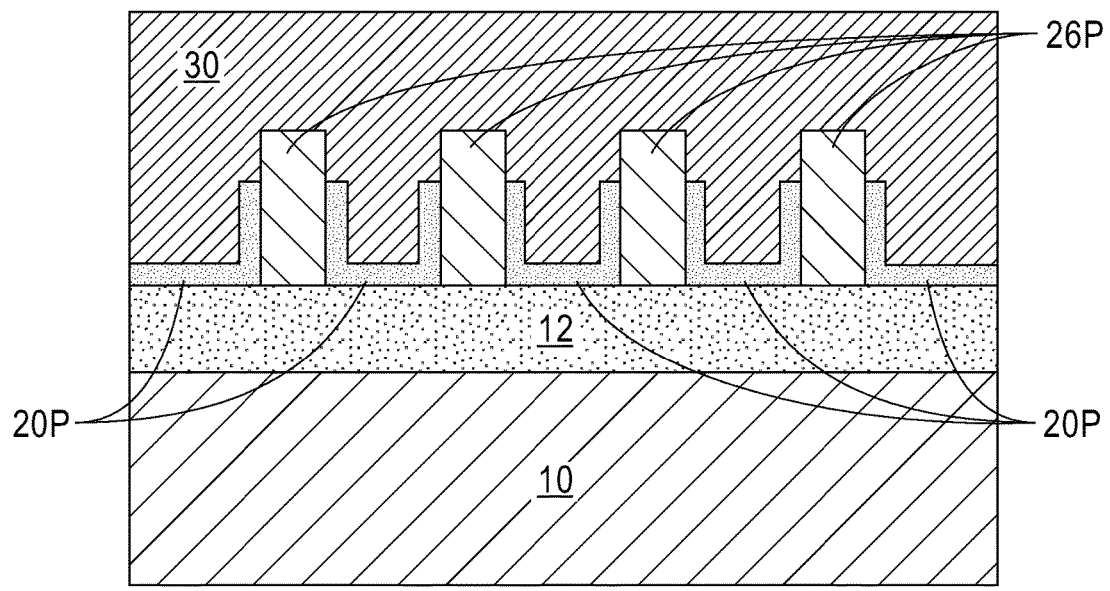
FIG. 11B is a cross sectional view of the exemplary semiconductor structure of FIG. 11A along vertical plane B-B'.
Figure 11C:
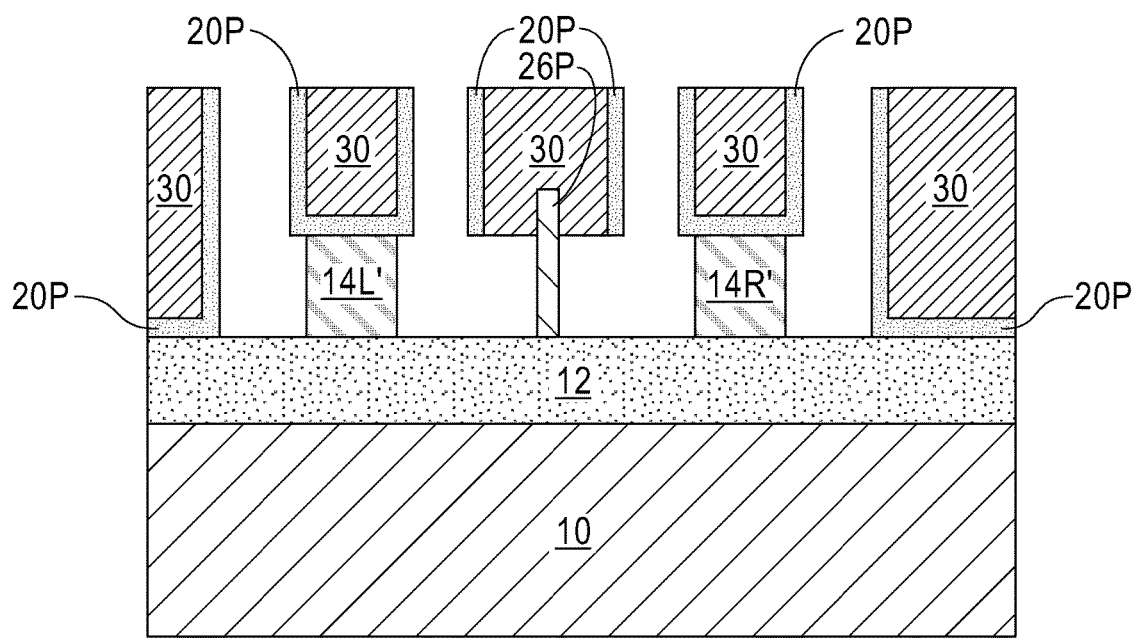
FIG. 11C is a cross sectional view of the exemplary semiconductor structure of FIG. 11A along vertical plane C-C'.

Referring now to FIGS. 11A-11C, there are illustrated the exemplary semiconductor structure of FIGS. 10A-10C after laterally etching portions of each SiGe structure 26 to provide a SiGe pillar 26P. Each SiGe pillar 26P has a width that is less than the original width of the SiGe structure 26. The lateral etching used in this step of the present application is selective in removing SiGe as compared to silicon. In one example, a high temperature chlorine gas can be used to provide the silicon pillars 26P.

Figure 12A:
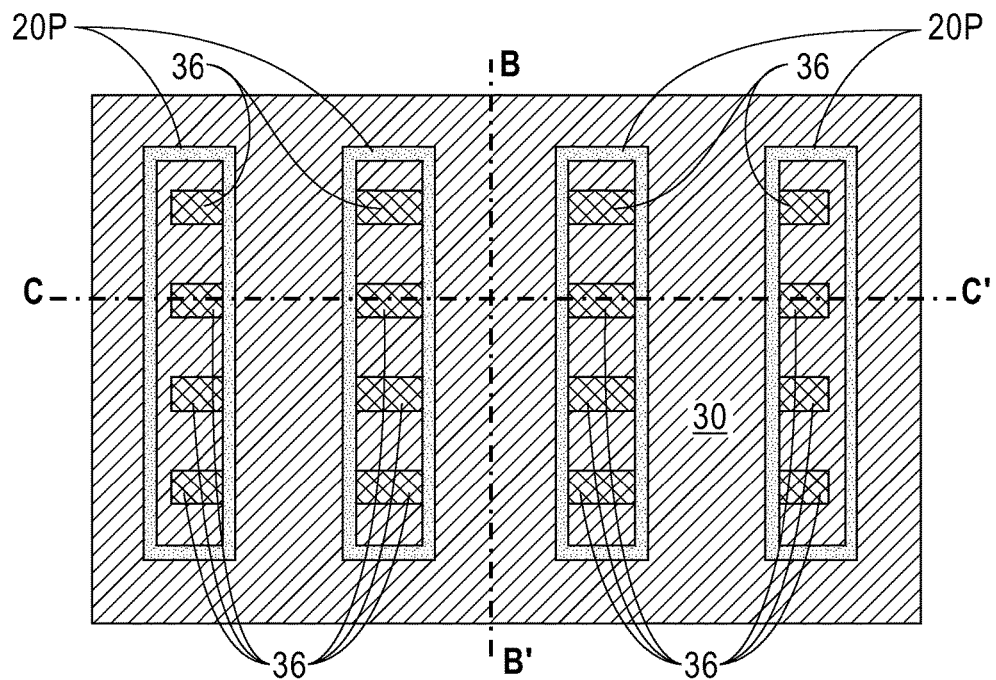
FIG. 12A is a top down view of the exemplary semiconductor structure of FIGS. 11A-11C after growing a III-V semiconductor material from exposed sidewalls of remaining portions of the SiGe structure and exposed sidewalls of remaining portions of the silicon fin.
Figure 12B:
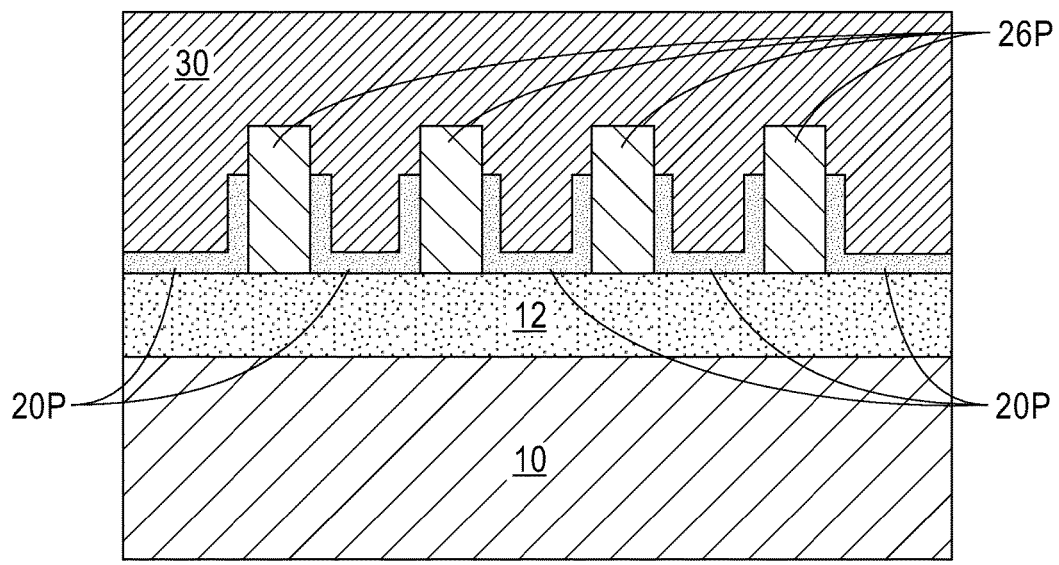
FIG. 12B is a cross sectional view of the exemplary semiconductor structure of FIG. 12A along vertical plane B-B'.
Figure 12C:
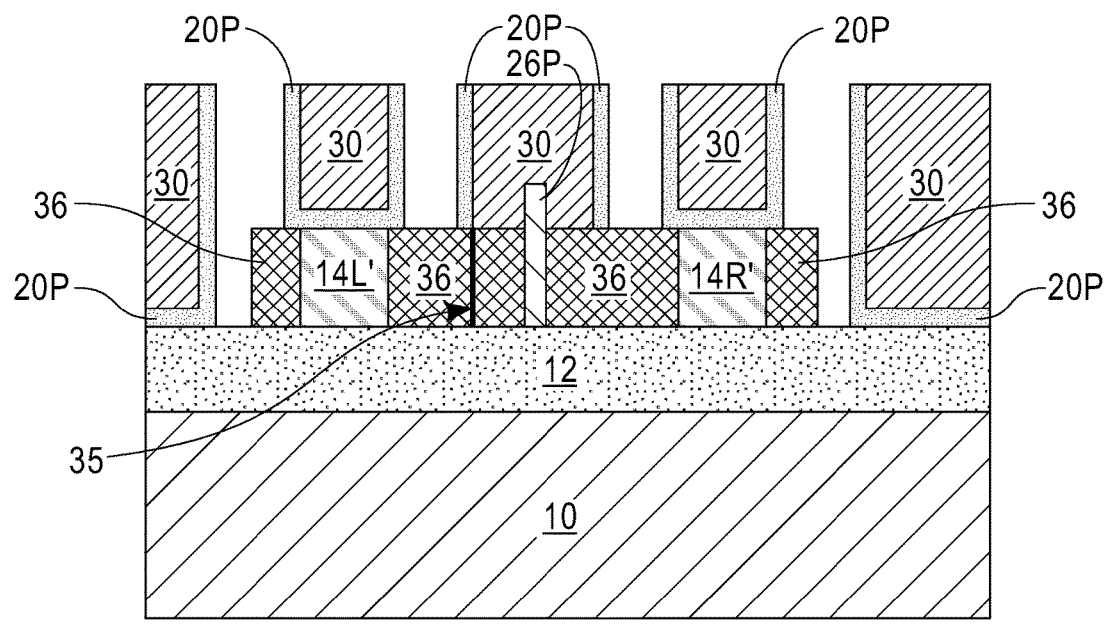
FIG. 12C is a cross sectional view of the exemplary semiconductor structure of FIG. 12A along vertical plane C-C'.

Referring now to FIGS. 12A-12C, there are illustrated the exemplary semiconductor structure of FIG. 11A-11C after growing a III-V semiconductor material 36 from exposed sidewalls of remaining portions of the SiGe structure (i.e., the SiGe pillar 26P) and exposed sidewalls of remaining portions of the silicon fin (i.e., the first silicon fin structure portion 14L' and the second silicon fin structure portion 14R'). The III-V semiconductor material 36 may be formed by an epitaxial growth (of deposition process) similar to that described above in forming the SiGe structures 26. In this step of the present application, the III-V semiconductor material 36 grows laterally from the exposed sidewall surfaces of each SiGe pillar 26P, first silicon fin structure portion 14L' and the second silicon fin structure portion 14R'). In the present application, the III-V semiconductor material 36 that is formed between the SiGe pillar 26P and the first silicon fin structure portion 14L', and between the SiGe pillar 26P and the second silicon fin structure portion 14R' will contain a growth front 35 that meets outside the channel area of the device; the channel area of the device is an area of the exemplary semiconductor structure in which the III-V semiconductor material 36 is located beneath a portion of a functional gate structure to be subsequently formed. Thus, defects are not present in the channel region.

The term "III-V" semiconductor material denotes a compound semiconductor that includes at least one element from Group III (i.e., Group 13) of the Periodic Table of Elements and at least one element from Group V (i.e., Group 15) of the Periodic Table of Elements. In one embodiment of the present application, the III-V semiconductor material 36 may be GaA, GaN, GaP, GaAs, InN, or InP. Other III-V compound semiconductors can also be used in the present application as the III-V semiconductor material 36.

The III-V semiconductor material 36 that is formed typically has a topmost surface that is coplanar with a topmost surface of the first and second silicon fin structure portions (14L', 14R'). The III-V semiconductor material 36 that is formed also has a bottommost surface that is in direct contact with a topmost surface of insulator layer 12.

In the illustrated embodiment, a III-V semiconductor material is used since it is a well known high mobility semiconductor channel material. Although III-V semiconductor materials are described and illustrated, other high mobility semiconductor channel materials than the base substrate used in providing the fins 14 such as, for example, group II-VI semiconductor or carbon based (graphene or CNT), can be used instead or in conjugation with, a III-V semiconductor material.

Figure 13A:
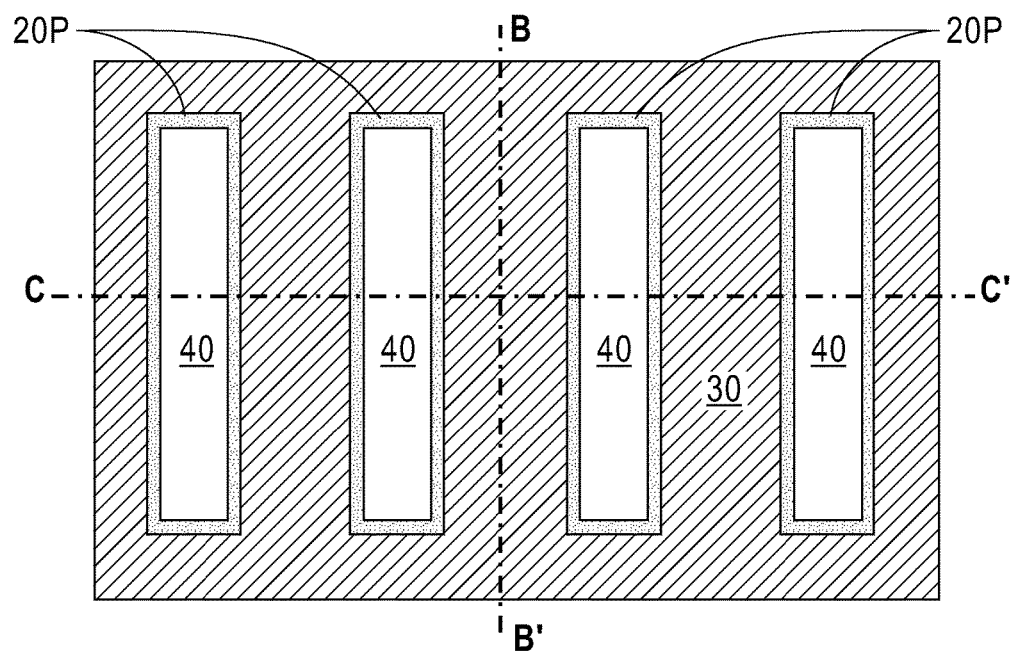
FIG. 13A is a top down view of the exemplary semiconductor structure of FIGS. 12A-12C after forming a functional gate structure in each gate cavity.
Figure 13B:
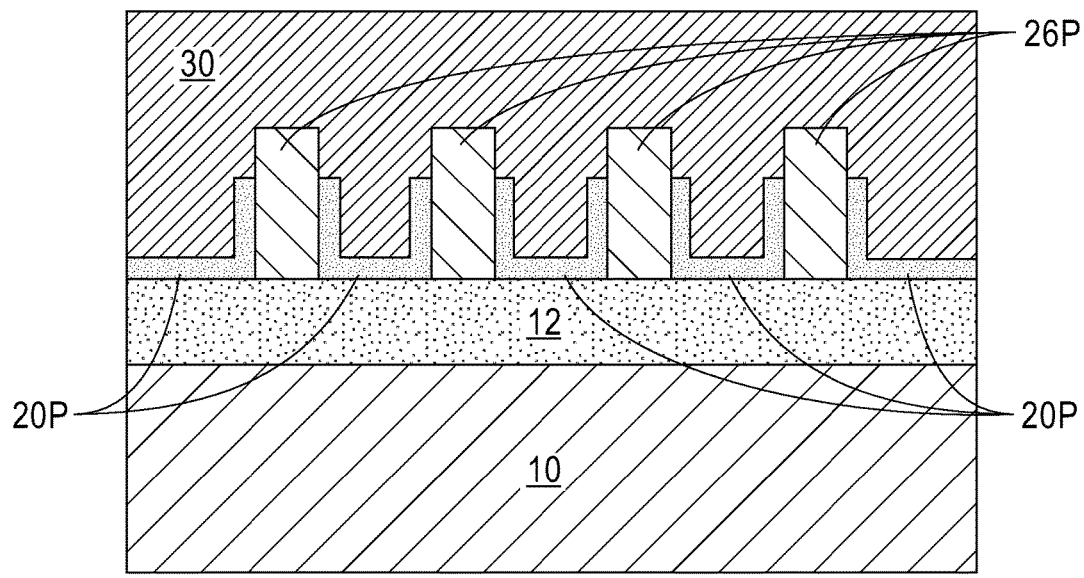
FIG. 13B is a cross sectional view of the exemplary semiconductor structure of FIG. 13A along vertical plane B-B'.
Figure 13C:
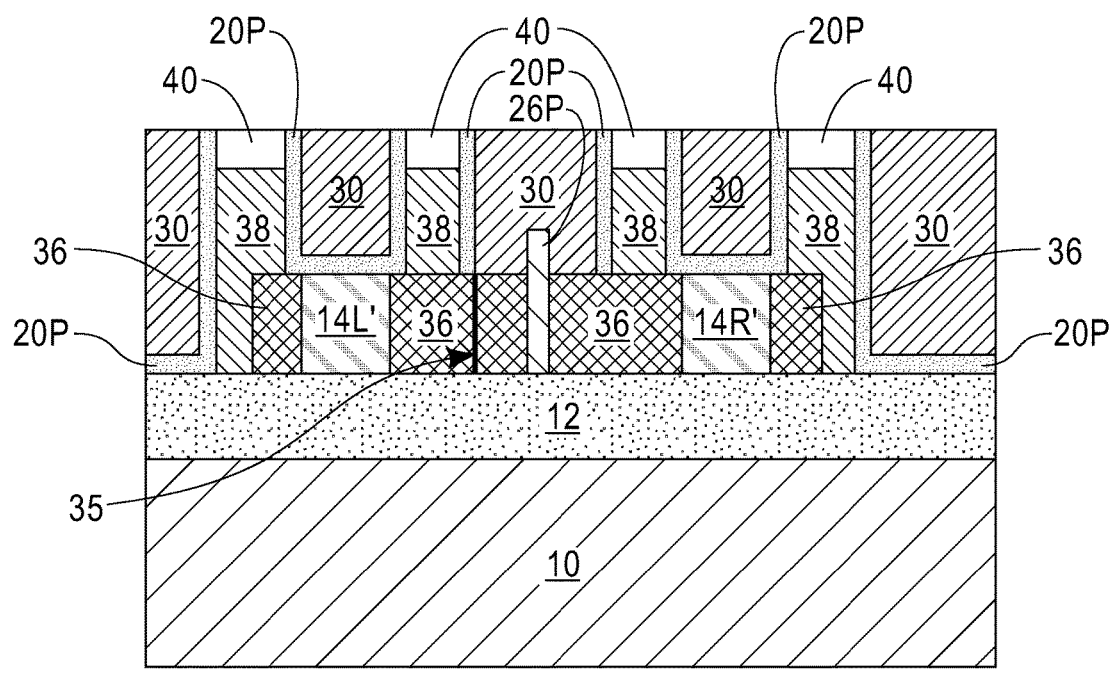
FIG. 13C is a cross sectional view of the exemplary semiconductor structure of FIG. 13A along vertical plane C-C'.

Referring now to FIGS. 13A-13C, there are illustrated the exemplary semiconductor structure of FIGS. 12A-12C after forming a functional gate structure 38 in each gate cavity 32'. In some embodiments, each functional gate structure 38 may include a gate cap portion 40.

Each functional gate structure 38 comprises a gate dielectric portion (not shown) and a gate electrode (or conductor) portion (not shown). In one embodiment, the gate dielectric portion of each functional gate structure 38 has a topmost surface that entirely contacts a bottommost surface of the overlying gate electrode portion. In another embodiment, the gate dielectric portion of each functional gate structure is U-shaped (i.e., has a horizontal bottommost surface and a sidewall surface that extends upwards from the edges of the horizontal bottommost surface). In such an embodiment, the gate electrode portion is located between the sidewall surface of the U-shaped gate dielectric portion and atop the bottommost horizontal surface of the U-shaped gate dielectric portion. Moreover, and in such an embodiment, the topmost surface of the U-shaped gate dielectric portion may be coplanar with a topmost surface of the gate electrode portion.

The gate dielectric material that provides the gate dielectric portion of each functional gate structure 38 can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric portion.

The gate dielectric material used in providing the gate dielectric portion of each functional gate structure 38 can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion of each functional gate structure 38 comprises a same gate dielectric material. In other embodiments, a gate dielectric portion of a first set of functional gate structures may comprise a first gate dielectric material, while a gate dielectric portion of a second set of functional gate structures may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

The gate electrode portion of each functional gate structure 38 comprises a gate conductor material. The gate conductor material used in providing each gate electrode portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate electrode portion of a first set of functional gate structures may comprise an nFET gate metal, while the gate electrode portion of a second set of functional gate structures may comprise a pFET gate metal.

The gate conductor material used in providing the gate electrode portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate electrode portions, block mask technology can be used. In one embodiment, the gate conductor material used in providing each gate electrode portion has a thickness from 1 nm to 100 nm. Other thicknesses that are lesser than, or greater than, the aforementioned thickness range can also be employed for the gate conductor material used in providing each gate electrode portion.

If present, the gate cap portion 40 comprises a gate cap material. The gate cap material that provides each gate cap portion 40 may include an oxide, nitride and/or oxynitride. In one embodiment, each gate cap portion 40 comprises silicon dioxide, silicon nitride, and/or silicon oxynitride. The dielectric material that provides each gate cap portion 40 can be formed utilizing a conventional deposition process such as, for example, chemical vapor deposition or plasma enhanced chemical vapor deposition. The dielectric material that provides each gate cap portion 40 can have a thickness from 5 nm to 20 nm. Other thicknesses that are lesser than, or greater than, the aforementioned thickness range can also be employed as the thickness of the dielectric material that provides each gate cap portion 40.

Each functional gate structure 38 can be formed by providing a functional gate material stack of, from bottom to top, the gate dielectric material, the gate conductor material and, if present and optionally, the gate cap material. The functional gate material stack can then planarized. In some embodiments, the gate dielectric material and the gate conductor material are first formed, then planarized and thereafter recessed, and then the gate cap portion is formed in the recessed region. Each functional gate structure 38 straddles over a portion of the III-V semiconductor material 36. The far left and right hand functional gate structures straddled over a topmost and sidewall surface of the III-V semiconductor material 36.

Figure 14A:
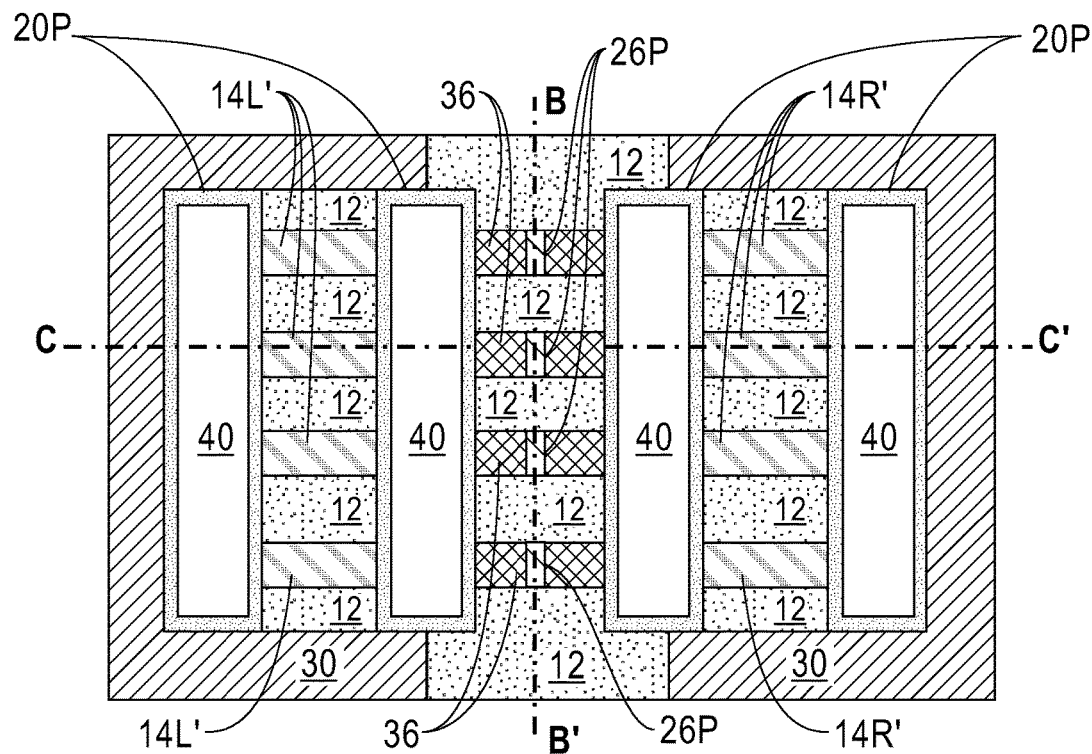
FIG. 14A is a top down view of the exemplary semiconductor structure of FIGS. 13A-13C after forming contact openings.
Figure 14B:
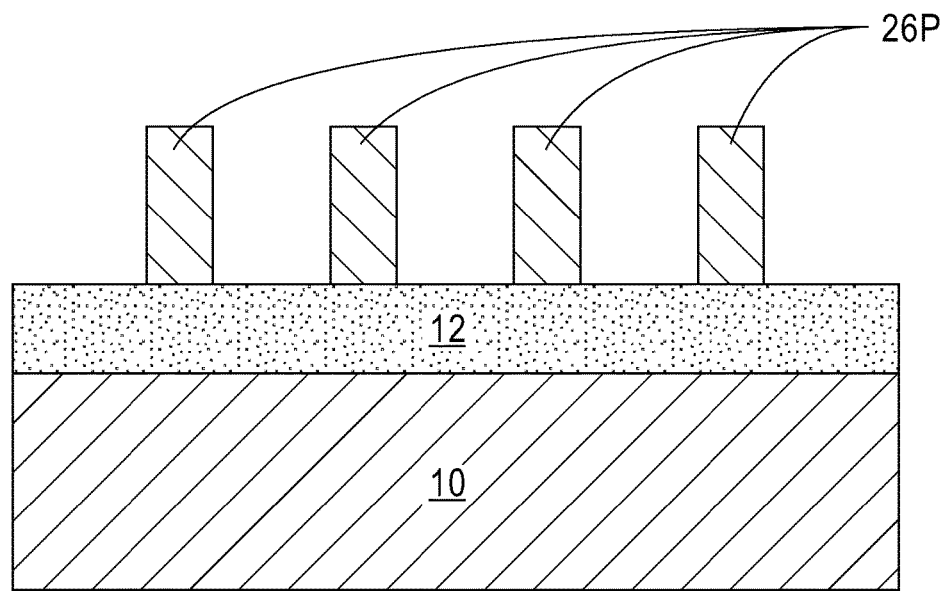
FIG. 14B is a cross sectional view of the exemplary semiconductor structure of FIG. 14A along vertical plane B-B'.
Figure 14C:
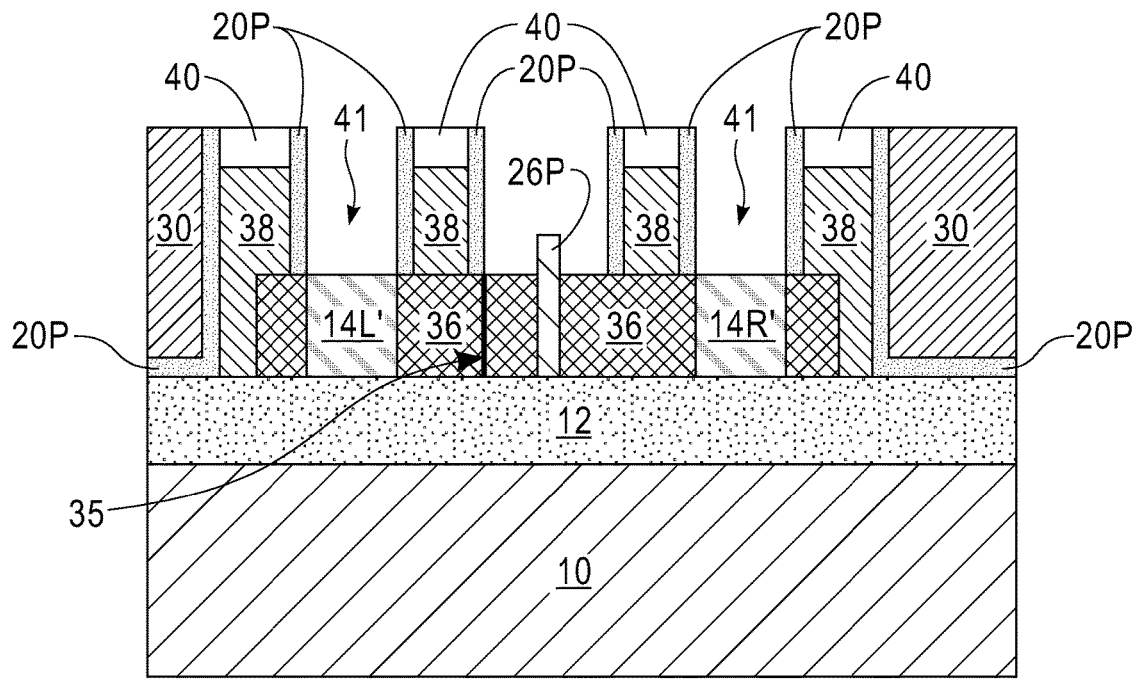
FIG. 14C is a cross sectional view of the exemplary semiconductor structure of FIG. 14A along vertical plane C-C'.

Referring now to FIGS. 14A-14C, there are illustrated the exemplary semiconductor structure of FIGS. 13A-13C after forming contact openings 41 on the source and drain sides of each functional gate structure. Each contacting opening 41 can be formed by etching that is self aligned to the gate and the silicon nitride portions 26P. The etching removes the MOL dielectric 30 from portions of the exemplary semiconductor structure so as to expose the first and second silicon fin structure portions (14L', 14R') and the SiGe pillar 26P; the etching exposes the source regions and drain regions for further processing.

Figure 15A:
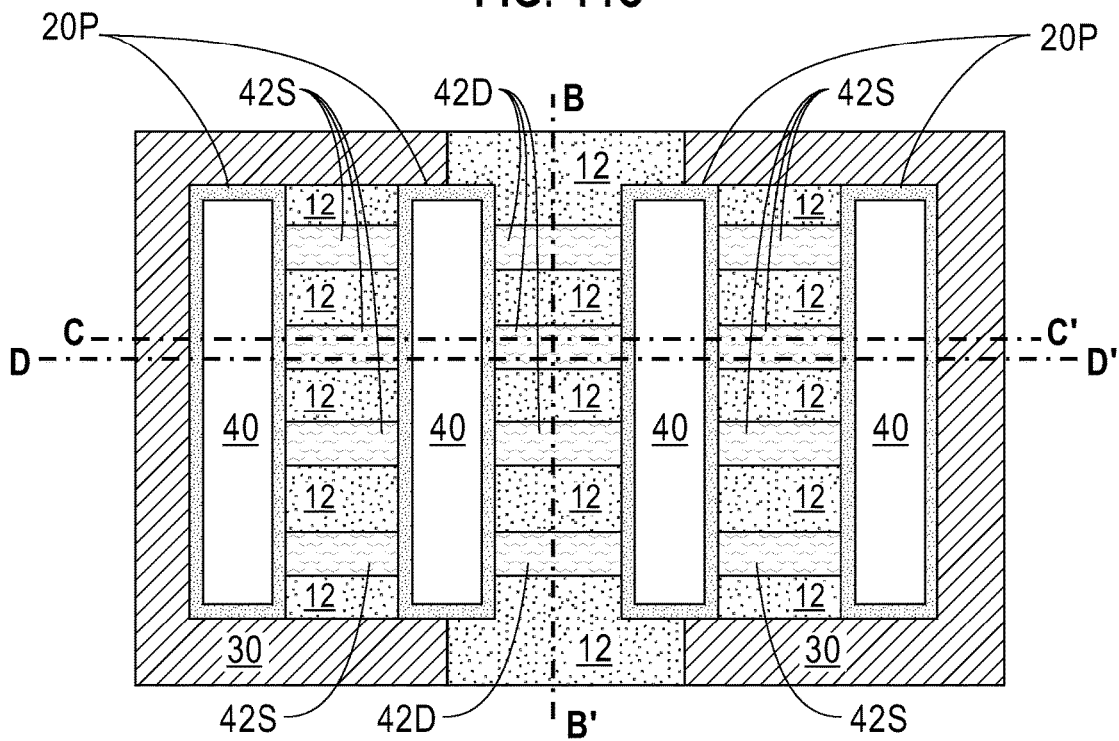
FIG. 15A is a top down view of the exemplary semiconductor structure of FIGS. 14A-14C after removing exposed portions of remaining portions of each silicon fin, each exposed SiGe pedestal and forming source regions and drain regions.
Figure 15B:
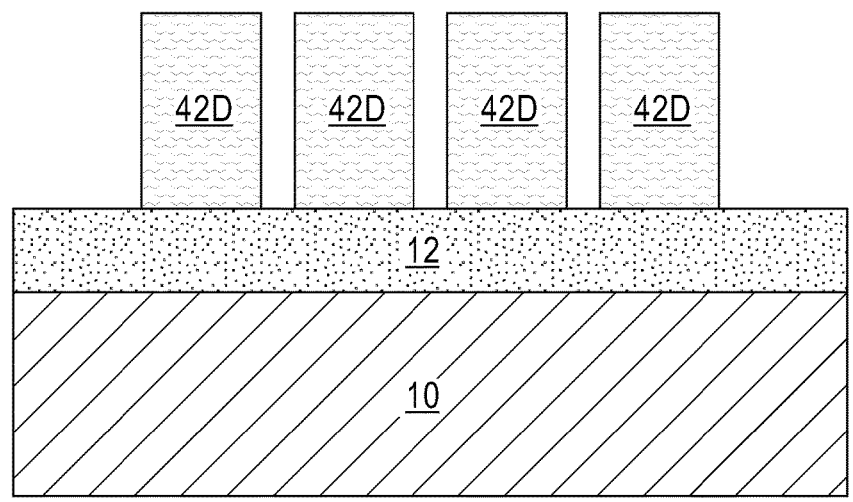
FIG. 15B is a cross sectional view of the exemplary semiconductor structure of FIG. 15A along vertical plane B-B'.
Figure 15C:
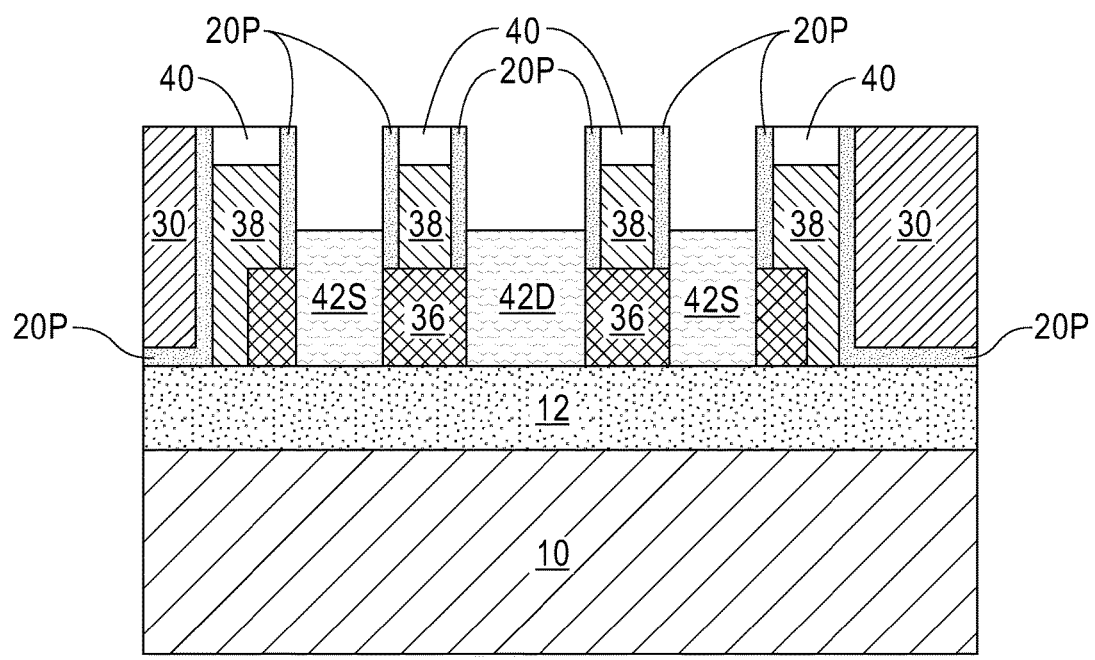
FIG. 15C is a cross sectional view of the exemplary semiconductor structure of FIG. 15A along vertical plane C-C'.
Figure 15D:
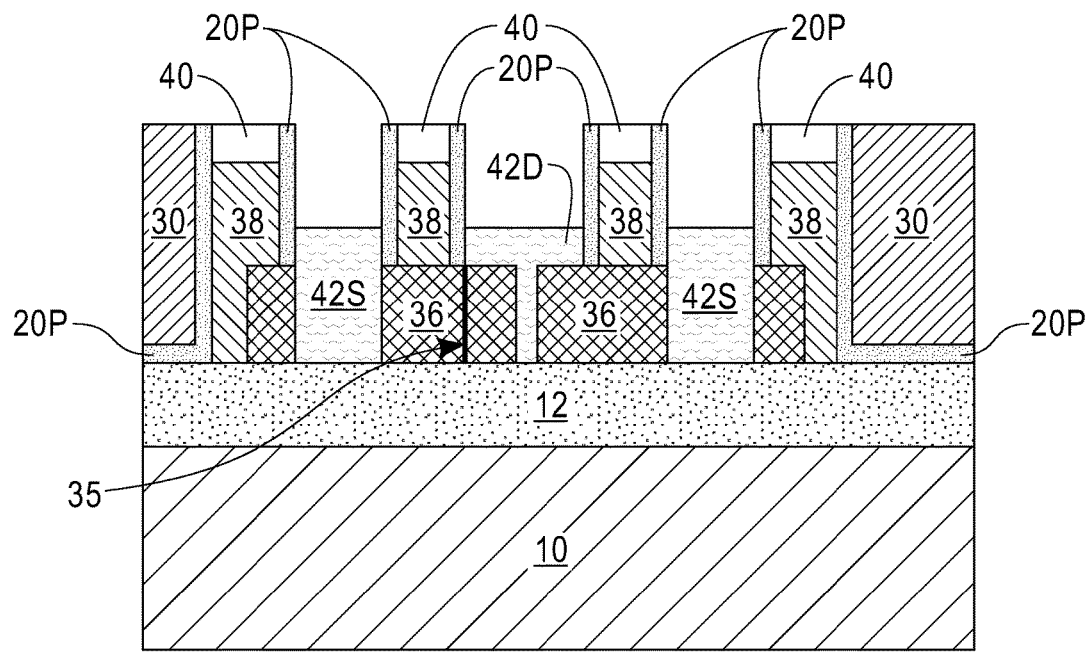
FIG. 15D is a cross sectional view of the exemplary semiconductor structure of FIG. 15A along vertical plane D-D'.
Figure 16A:
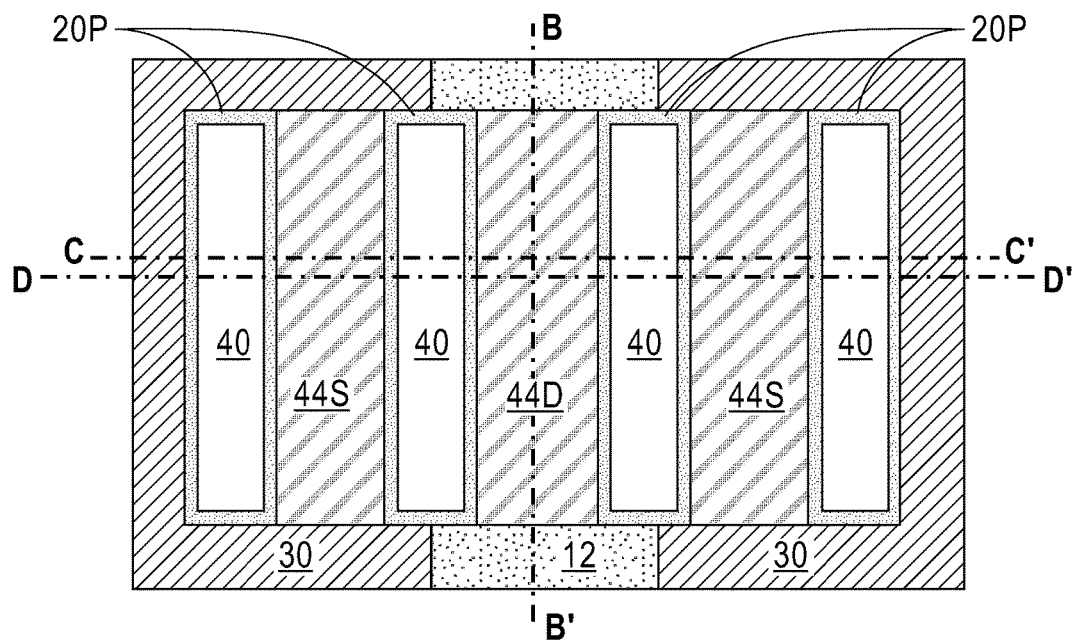
FIG. 16A is a top down view of the exemplary semiconductor structure of FIGS. 15A-15D after forming a source-side contact metal structure and a drain-side contact metal structure.
Figure 16B:
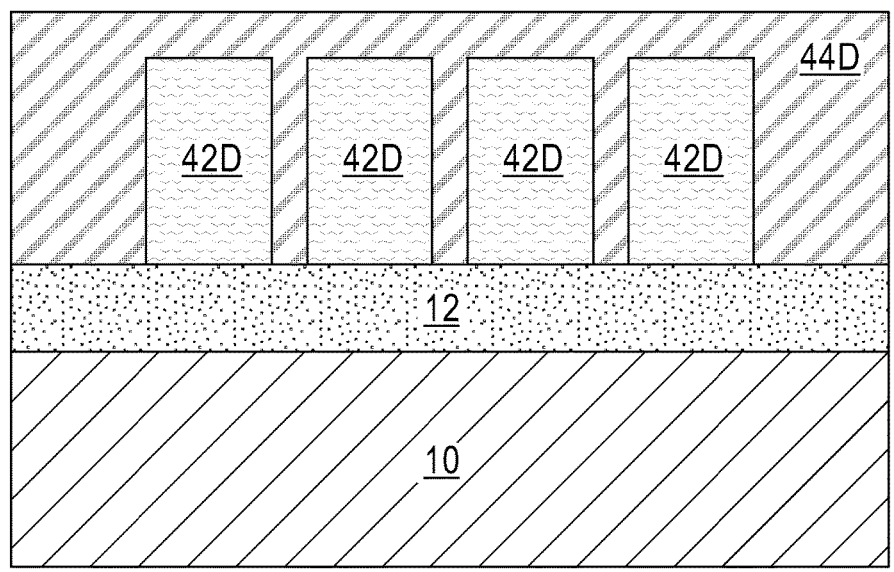
FIG. 16B is a cross sectional view of the exemplary semiconductor structure of FIG. 16A along vertical plane B-B'.
Figure 16C:
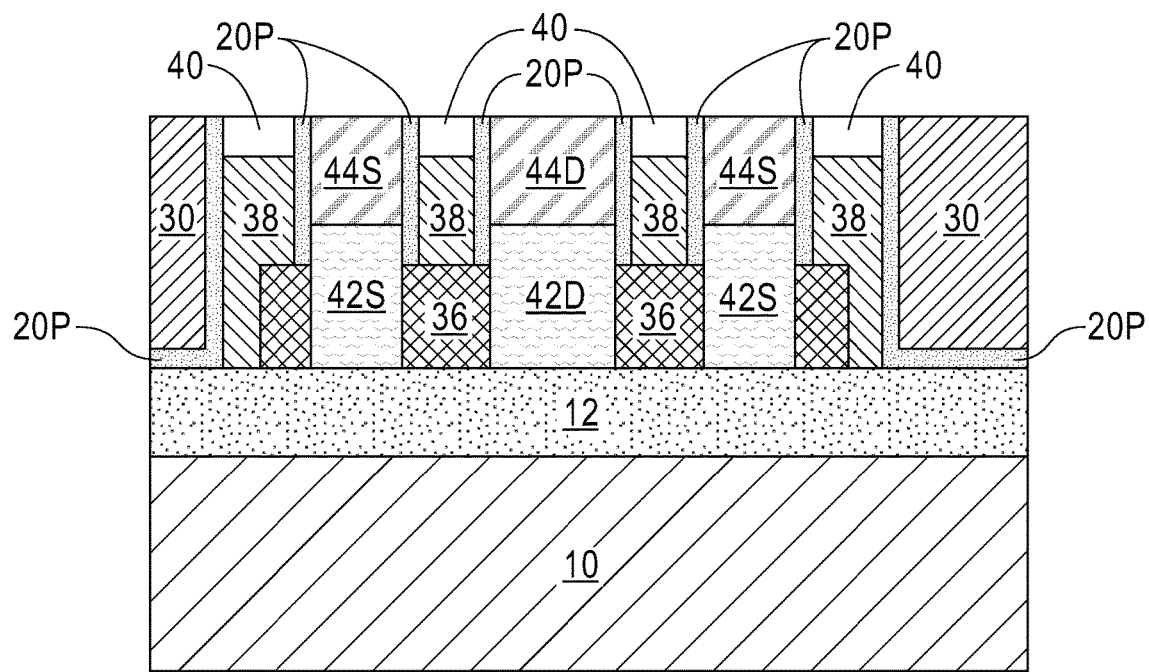
FIG. 16C is a cross sectional view of the exemplary semiconductor structure of FIG. 16A along vertical plane C-C'.
Figure 16D:
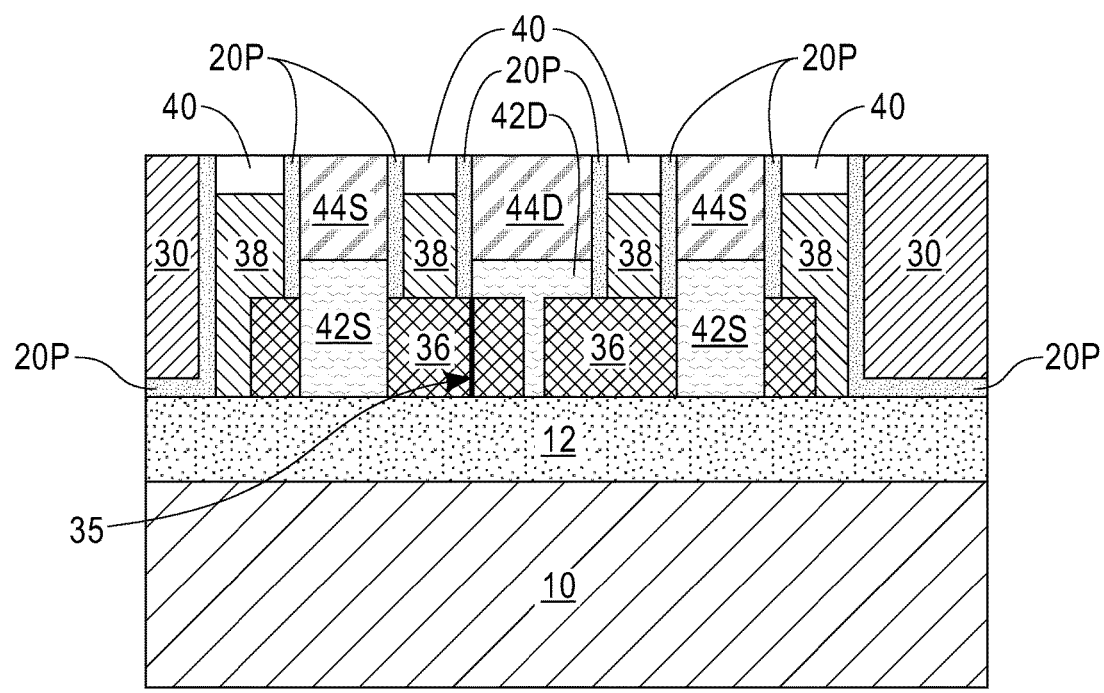
FIG. 16D is a cross sectional view of the exemplary semiconductor structure of FIG. 16A along vertical plane D-D'.

Referring now to FIGS. 15A-15D, there are illustrated the exemplary semiconductor structure of FIGS. 14A-14C after removing exposed portions of the remaining portions of each silicon fin, each exposed SiGe pedestal and forming a source-side epitaxial doped semiconductor material 42S and a drain-side epitaxial doped semiconductor material 42D. The removing the exposed and remaining portions of the silicon fin (i.e., the first and second silicon fin structure portions (14L', 14R') and each exposed SiGe pedestal 26P can be performed utilizing one or more etching steps. The one or more etching steps expose a topmost surface of the insulator layer 12 and sidewall surfaces of each III-V semiconductor material 36. The source-side and the drain-side epitaxial doped semiconductor materials are then formed. As is shown in FIG. 15D, the drain-side epitaxial doped semiconductor material 42D has an extending portion that extends to, and directly contacts a portion of the topmost surface of insulator layer 12. The extending portion of the drain-side epitaxial doped semiconductor material 42D is located between two III-V semiconductor materials 36 that are not merged. Moreover, the drain-side epitaxial doped semiconductor material 36 has a surface that directly contacts a topmost surface of each portion of each III-V semiconductor material 36 that extends beyond a sidewall surface of the functional gate structures 38, another surface that direct contacts a sidewall surface of each portion of each III-V semiconductor material 36 that extends beyond a sidewall surface of the functional gate structures 38, and yet another surface that directly contacts a topmost surface of insulator layer In the embodiment illustrated, both the source-side epitaxial doped semiconductor material 42S and a drain-side epitaxial doped semiconductor material 42D have a topmost surface that is planar, i.e., flat. In some embodiments, a faceted topmost surface may be obtained for the source-side epitaxial doped semiconductor material 42S and a drain-side epitaxial doped semiconductor material 42D. The topmost surface of the source-side epitaxial doped semiconductor material 42S and a drain-side epitaxial doped semiconductor material 42D are beneath a topmost surface of each functional gate structure 38.

The source-side epitaxial doped semiconductor material 42S includes a semiconductor material that differs from the III-V semiconductor material 36 (i.e., silicon or SiGe) and either an n-type or a p-type dopant. The term "n-type dopant" refers to an impurity that when added to an intrinsic semiconductor material contributes free electrons to the intrinsic semiconductor material. In a III-V containing material, examples of n-type dopants include, but are not limited to, silicon, germanium, selenium, or telerium. The term "p-type dopant" refers to an impurity that when added to an intrinsic semiconductor material creates to deficiencies of valance electrons. In a III-V containing semiconductor material, examples of p-type dopants include, but are not limited to, Zn, or other Group III materials.

The drain-side epitaxial doped semiconductor material 42D includes a semiconductor material that differs from the III-V semiconductor material 36 (i.e., silicon or SiGe) and either an n-type or a p-type dopant, as defined above.

In one embodiment, the source-side epitaxial doped semiconductor material 42S and the drain-side epitaxial doped semiconductor material 42D can be formed by an in-situ doped epitaxial growth process. In another embodiment, the source-side epitaxial doped semiconductor material 42S and the drain-side epitaxial doped semiconductor material 42D can be formed by first epitaxially growing an intrinsic semiconductor material and thereafter introducing n-type dopants or p-type dopants into the intrinsic semiconductor material by ion implantation or gas phase doping In one embodiment, the dopant is present in the source-side epitaxial doped semiconductor material 42S and the drain-side epitaxial doped semiconductor material 42D in a concentration ranging from $1\times10^{19}$ atoms/cm$^3$ to $10^{21}$ atoms/cm$^3$. The concentration of dopant within the source-side epitaxial doped semiconductor material 42S an can be equal to, greater than, or less than the concentration of dopant within the drain-side epitaxial doped semiconductor material 42D.

In one embodiment of the present application, the dopant can be uniformly present in the source-side epitaxial doped semiconductor material 42S and/or the drain-side epitaxial doped semiconductor material 42D. In another of the present application, the dopant can be present as a gradient in the source-side epitaxial doped semiconductor material 42S and/or the drain-side epitaxial doped semiconductor material 42D. It is noted that the source drain region consists of the drain-side epitaxial doped semiconductor material 42D and an underlying portion of the III-V semiconductor material 36, while the source region consists of the source-side epitaxial doped semiconductor material 42S. Thus, the source region and the drain region of the present application are asymmetric in terms of containing different semiconductor materials. The portion of the III-V semiconductor material 36 that is directly beneath the functional gate structure 38 represent a channel region of the device.

Referring now to FIGS. 16A-16D, there are illustrated the exemplary semiconductor structure of FIGS. 15A-15D after forming a source-side contact metal structure 44S and a drain-side contact metal structure 44D. The source-side contact metal structure 44S is formed atop each source-side epitaxial doped semiconductor material 42S within a respective contact opening 41, and the drain-side contact metal structure is formed atop each drain-side epitaxial doped semiconductor material 42D within a respective contact opening 41.

The source-side contact metal structure 44S and the drain-side contact metal structure 44D may include a metal semiconductor alloy such as, for example, a metal silicide, a contact metal, a contact metal alloy or a multilayered stack thereof. Examples of contact metals include, but are not limited to copper, aluminum, tungsten, ruthenium, cobalt or alloys thereof. The source-side contact metal structure 44S and the drain-side contact metal structure 44D can be formed by a deposition process such as, for example, chemical vapor deposition, plasma enhanced chemical vapor deposition, plating, or physical vapor deposition. Following the deposition process, the topmost conductive metal that provides the source-side contact metal structure 44S and the drain-side contact metal structure 44D may be subjected to a planarization process such as, for example, chemical mechanical polishing and/or grinding. In some embodiments, a metal silicide process can be used in forming the source-side contact metal structure 44S and the drain-side contact metal structure 44D. In such a process, a metal semiconductor alloy forming metal such as, for example, nickel, platinum, cobalt or alloys thereof is (are) first deposited, a diffusion barrier such as, for example, TiN or TaN can be formed atop the metal semiconductor alloy forming metal, an anneal can then be performed that causes reaction between the metal semiconductor alloy forming metal and the underlying source-side epitaxial doped semiconductor material 42S or drain-side epitaxial doped semiconductor material 42D and thereafter any excess non reacted semiconductor alloy formed metal and the diffusion barrier can be removed.

Notably, FIGS. 16A-16D (see also FIGS. 15A-15D) illustrate a semiconductor structure of the present application that includes at least one functional gate structure (either of the two middle functional gates 38) straddling over a surface of a high mobility semiconductor channel material (i.e., III-V semiconductor material 36). The semiconductor structure further includes a source region located on one side of the at least one functional gate structure and containing a source-side epitaxial doped semiconductor material 42S extending laterally from a sidewall surface of the high mobility semiconductor channel material (i.e., III-V semiconductor material 36). The semiconductor structure even further includes a drain region located on another side of the at least one functional gate structure and containing a drain-side epitaxial doped semiconductor material 42D and a portion of the high mobility semiconductor channel material (i.e., the III-V semiconductor material 36 containing growth front 35) that extends beyond a sidewall surface of the at least one functional gate structure. In accordance with the present application, the source-side epitaxial doped semiconductor material 42S and the drain-side epitaxial doped semiconductor material 42D comprise a different semiconductor material than the high mobility semiconductor channel material (i.e., the III-V semiconductor material 36).

Although the present application specifically described and illustrates semiconductor fins, the present application can also be employed for semiconductor nanowires or stack nanowires.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
   at least one functional gate structure straddling over a surface of a high mobility semiconductor channel material;
   a source region located on one side of said at least one functional gate structure and consisting of a source-side epitaxial doped semiconductor material extending laterally from a sidewall surface of said high mobility semiconductor channel material; and
   a drain region located on another side of said at least one functional gate structure and consisting of a drain-side epitaxial doped semiconductor material and a portion of said high mobility semiconductor channel material that extends beyond a sidewall surface of said at least one functional gate structure, wherein said source-side epitaxial doped semiconductor material and said drain-side epitaxial doped semiconductor material comprise a different semiconductor material than said high mobility semiconductor channel material.

2. The semiconductor structure of claim 1, wherein said drain-side epitaxial doped semiconductor material has a first surface that directly contacts a topmost surface of said high mobility semiconductor channel material that extends beyond said sidewall surface of said at least one functional gate structure, a second surface that directly contacts a sidewall surface of said high mobility semiconductor channel material that extends beyond said sidewall surface of said at least one functional gate structure, and a third surface that directly contacts a topmost surface of a substrate.

3. The semiconductor structure of claim 2, wherein said substrate is an insulator layer.

4. The semiconductor structure of claim 1, wherein said high mobility semiconductor channel material is a III-V semiconductor material.

5. The semiconductor structure of claim 1, further comprising a silicon nitride portion located on each sidewall surface of said at least one functional gate structure.

6. The semiconductor structure of claim 5, further comprising a middle-of-the-line (MOL) located adjacent said silicon nitride portion and surrounding said at least one functional gate structure.

7. The semiconductor structure of claim 1, wherein said high mobility semiconductor channel material that extends beyond said sidewall surface of said at least one functional gate structure contains growth front containing defects.

8. The semiconductor structure of claim 1, further comprising a source-side contact metal structure located on a surface of said source-side epitaxial doped semiconductor material and a and the drain-side contact metal structure located on a surface of said drain-side epitaxial doped semiconductor material.

9. The semiconductor structure of claim 8, wherein said source-side contact metal structure and said drain-side contact metal structure have a topmost surface that coplanar with a topmost surface of said at least one functional gate structure.

10. The semiconductor structure of claim 9, further comprising a silicon nitride portion separating said source-side contact metal structure and said drain-side contact metal structure from an upper portion of said at least one functional gate structure, said silicon nitride portion is located on said surface of said high mobility semiconductor channel material.

11. The semiconductor structure of claim 1, wherein said source-side epitaxial doped semiconductor material and said drain-side epitaxial doped semiconductor material have an epitaxial relationship with said high mobility semiconductor channel material.

12. The semiconductor structure of claim 1, wherein said source-side epitaxial doped semiconductor material and said drain-side epitaxial doped semiconductor material have a planar topmost surface that is located beneath a topmost surface of said at least one functional gate structure.

13. The semiconductor structure of claim 1, wherein said source-side epitaxial doped semiconductor material and said drain-side epitaxial doped semiconductor material have a faceted planar topmost surface that is located beneath a topmost surface of said at least one functional gate structure.

14. The semiconductor structure of claim 1, wherein said source-side epitaxial doped semiconductor material and said drain-side epitaxial doped semiconductor material have a topmost surface that is located beneath a topmost surface of said at least one functional gate structure.

15. The semiconductor structure of claim 1, wherein said at least one functional gate structure comprises a gate dielectric portion and a gate electrode portion.

16. The semiconductor structure of claim 15, wherein said gate dielectric portion is U-shaped, and said gate electrode portion is located between a sidewall surface of said gate dielectric portion and atop a bottommost horizontal surface of said gate dielectric portion.

17. The semiconductor structure of claim 15, wherein said at least one functional gate structure further comprises a gate cap portion located atop said gate dielectric portion and said gate electrode portion.

18. The semiconductor structure of claim 1, wherein said high mobility semiconductor channel material has a bottommost surface that is coplanar with a bottommost surface of said source-side epitaxial doped semiconductor material and a bottommost surface of said drain-side epitaxial doped semiconductor material.

* * * * *